(12) United States Patent
Kim et al.

(10) Patent No.: US 10,930,722 B2
(45) Date of Patent: Feb. 23, 2021

(54) DISPLAY DEVICE

(71) Applicant: LG Display Co., Ltd., Seoul (KR)

(72) Inventors: Dong-Young Kim, Paju-si (KR); Kyoung-Nam Lim, Gyeongsangbuk-do (KR); Yu-Ho Jung, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/206,820

(22) Filed: Nov. 30, 2018

(65) Prior Publication Data

US 2019/0189721 A1    Jun. 20, 2019

(30) Foreign Application Priority Data

Dec. 19, 2017 (KR) ........................ 10-2017-0175055

(51) Int. Cl.
*H01L 27/32* (2006.01)
*H01L 27/12* (2006.01)
*G02F 1/1362* (2006.01)
*G02F 1/1368* (2006.01)
(Continued)

(52) U.S. Cl.
CPC ........ *H01L 27/3262* (2013.01); *G02F 1/1368* (2013.01); *G02F 1/136227* (2013.01);
(Continued)

(58) Field of Classification Search
CPC ............. H01L 27/3262; H01L 27/1244; H01L 27/1251; H01L 27/1248; H01L 27/3276;
(Continued)

(56) References Cited

U.S. PATENT DOCUMENTS 10,475,817 B2 * 11/2019 Choo ................ H01L 29/66795
2014/0217397 A1    8/2014 Kwak et al.
(Continued)

FOREIGN PATENT DOCUMENTS

EP    2 278 618 A1    1/2011
EP    2 814 074 A1    12/2014
(Continued)

OTHER PUBLICATIONS

European Patent Office, Extended European Search Report and Opinion, EP Patent Application No. 18212895.9, dated May 3, 2019, nine pages.
(Continued)

*Primary Examiner* — Matthew L Reames
(74) *Attorney, Agent, or Firm* — Fenwick & West LLP

(57) ABSTRACT

A display device is capable of realizing low power consumption since a first thin-film transistor having a polycrystalline semiconductor layer and a second thin-film transistor having an oxide semiconductor layer are disposed in an active area. In addition, an opening formed in a bending area is formed to have the same depth as at least one of a plurality of contact holes formed in at least one inorganic insulation layer, which is disposed in the active area, and source and drain electrodes of the second thin-film transistor and source and drain electrodes of the first thin-film transistor, which are disposed below the oxide semiconductor layer, are formed in the same plane using the same material, which simplifies the manufacturing process of the display device.

21 Claims, 23 Drawing Sheets

(51) Int. Cl.
*H01L 51/52* (2006.01)
*H01L 29/786* (2006.01)

(52) U.S. Cl.
CPC ........ *H01L 27/124* (2013.01); *H01L 27/1225* (2013.01); *H01L 27/1244* (2013.01); *H01L 27/1248* (2013.01); *H01L 27/1251* (2013.01); *H01L 27/3248* (2013.01); *H01L 27/3258* (2013.01); *H01L 27/3265* (2013.01); *H01L 27/3276* (2013.01); *H01L 51/5237* (2013.01); *H01L 29/7869* (2013.01); *H01L 29/78675* (2013.01)

(58) Field of Classification Search
CPC ............. H01L 27/1225; H01L 27/3265; H01L 29/7869; H01L 29/78675; H01L 27/124; H01L 27/3258; H01L 51/5237; H01L 27/3248; G02F 1/136227; G02F 1/1368
See application file for complete search history.

(56) References Cited

U.S. PATENT DOCUMENTS

| | | |
|---|---|---|
| 2015/0382446 A1 | 12/2015 | Kwon et al. |
| 2016/0066409 A1 | 3/2016 | Kwon et al. |
| 2016/0087022 A1 | 3/2016 | Tsai et al. |
| 2017/0040406 A1 | 2/2017 | Park et al. |

FOREIGN PATENT DOCUMENTS

| | | |
|---|---|---|
| EP | 3 182 473 A1 | 6/2017 |
| EP | 3 188 269 A1 | 7/2017 |
| KR | 10-2011-0006812 A | 1/2011 |
| KR | 10-2013-0069048 A | 6/2013 |
| KR | 10-2014-0099164 A | 8/2014 |
| KR | 10-2015-0101409 A | 9/2015 |
| KR | 10-2015-0101418 A | 9/2015 |
| KR | 10-2016-0027907 A | 3/2016 |
| KR | 10-2016-0093202 A | 8/2016 |
| KR | 10-2017-0106621 A | 9/2017 |
| KR | 10-2017-0114029 A | 10/2017 |
| KR | 10-2017-0136484 A | 12/2017 |

OTHER PUBLICATIONS

Japan Patent Office, Decision of Rejection, JP Patent Application No. 2018-230539, dated Jun. 23, 2020, nine pages.

* cited by examiner

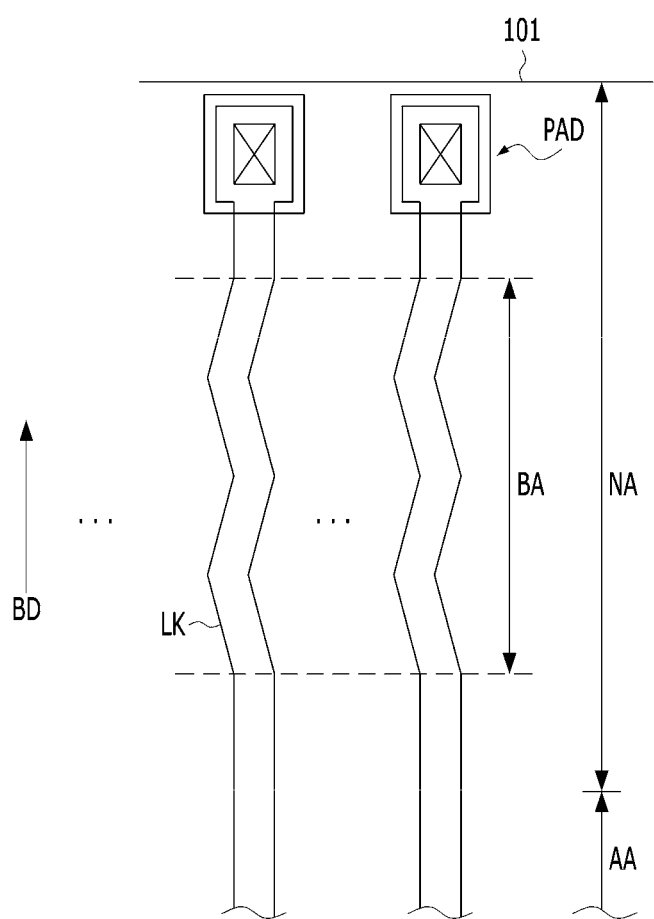

DISPLAY DEVICE

CROSS-REFERENCE TO RELATED APPLICATIONS

This application claims the benefit of Republic of Korea Patent Application No. 10-2017-0175055, filed on Dec. 19, 2017, which is hereby incorporated by reference in its entirety.

BACKGROUND

Field of Disclosure

The present disclosure relates to a display device, and more particularly, to a display device capable of realizing low power consumption.

Discussion of the Related Art

An image display device, which reproduces various pieces of information on a screen, is a core technology of the information and communication age, and is being developed in the direction of becoming thinner, lighter, and having higher performance. Thus, a flat panel display device capable of reducing the disadvantageous weight and volume of a cathode ray tube (CRT) is in the spotlight.

Examples of such a flat panel display device include a liquid crystal display (LCD) device, a plasma display panel (PDP), an organic light-emitting display (OLED) device, and an electrophoretic display (ED) device.

As the development of personal electronic devices becomes more active, the flat panel display device is being developed in order to realize a product having excellent portability and/or wearability. As such, a display device capable of realizing low power consumption is required in order to be applied to a portable or wearable device. However, there is a difficulty in realizing low power consumption with the technologies related to display devices developed to date.

SUMMARY OF THE DISCLOSURE

Accordingly, the present disclosure is directed to a display device that substantially obviates one or more problems due to limitations and disadvantages of the related art.

The present disclosure has been provided to solve the problems described above, and an object of the present disclosure is to provide a display device capable of realizing low power consumption.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, the present disclosure may realize low power consumption since a first thin-film transistor having a polycrystalline semiconductor layer and a second thin-film transistor having an oxide semiconductor layer are disposed in an active area. In addition, an opening formed in a bending area is formed to have the same depth as at least one of a plurality of contact holes formed in at least one inorganic insulation layer, which is disposed in the active area, and source and drain electrodes of the second thin-film transistor and source and drain electrodes of the first thin-film transistor, which are disposed below the oxide semiconductor layer, are formed in the same plane using the same material, which may simplify the manufacturing process of a display device.

It is to be understood that both the foregoing general description and the following detailed description of the present disclosure are exemplary and explanatory and are intended to provide further explanation of the disclosure as claimed.

BRIEF DESCRIPTION

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIGS. 4A and 4B are plan views illustrating embodiments of a signal link disposed in a bending area illustrated in FIG. 1 according to the present disclosure;

DETAILED DESCRIPTION OF THE DISCLOSURE

Figure 1:
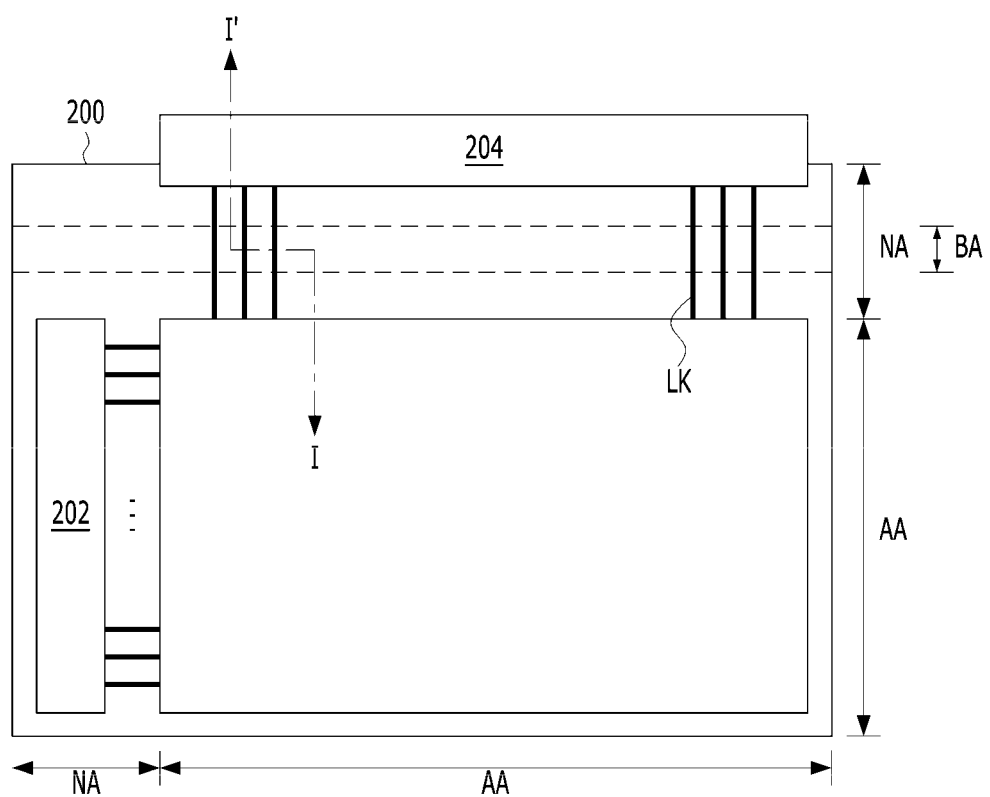
FIG. 1 is a plan view illustrating a display device according to the present disclosure.

Hereinafter, exemplary embodiments according to the present disclosure will be described in detail with reference to the accompanying drawings. Like reference numerals generally denote like elements throughout the specification.

Figure 2:
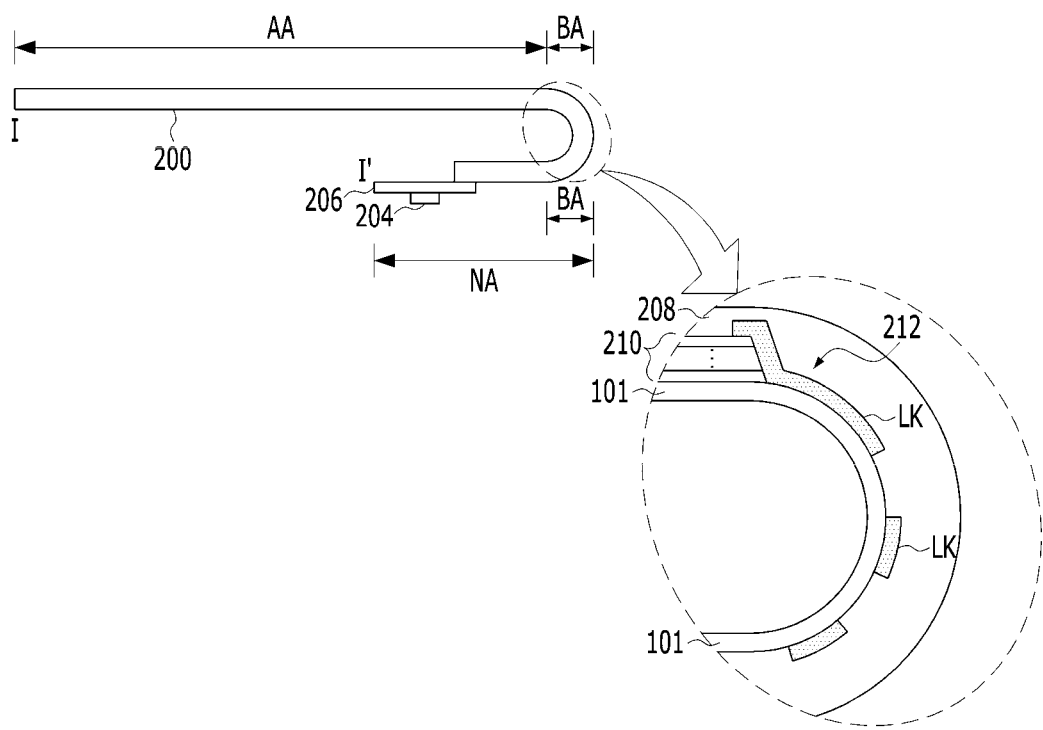
FIG. 2 is a cross-sectional view illustrating the display device taken along line "I-I'" of FIG. 1 according to the present disclosure.

FIG. 1 is a plan view illustrating a display device according to the present disclosure, and FIG. 2 is a cross-sectional view illustrating the display device according to the present disclosure.

The display device, illustrated in FIGS. 1 and 2, includes a display panel 200, a scan-driving unit 202, and a data-driving unit 204.

The display panel 200 is divided into an active area AA provided on a substrate 101 and a non-active area NA disposed around the active area AA. The substrate 101 is formed of a flexible plastic material so as to be bendable. For example, the substrate 101 is formed of polyimide (PI), polyethylene terephthalate (PET), polyethylene naphthalate (PEN), polycarbonate (PC), polyestersulfone (PES), polyacrylate (PAR), polysulfone (PSF), circlic-olefin copolymer (COC), or the like.

Figure 3A:
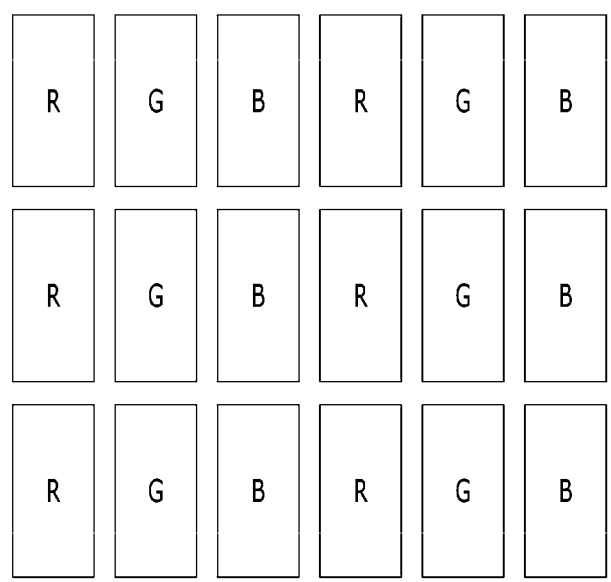
FIGS. 3A and 3B are plan views illustrating subpixels disposed in an active area illustrated in FIG. 1 according to the present disclosure.
Figure 3B:
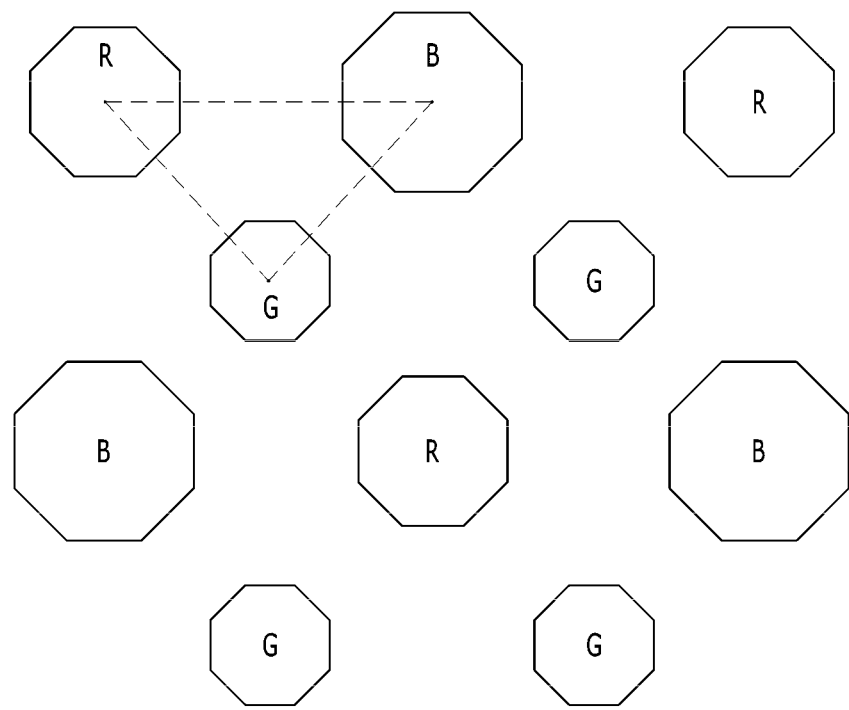

The active area AA displays an image using unit pixels arranged in a matrix form. The unit pixel may include red (R), green (G), and blue (B) subpixels, or may include red (R), green (G), blue (B), and white (W) subpixels. In one example, red (R), green (G), and blue (B) subpixels may be arranged along the same virtual horizontal line, as illustrated in FIG. 3A. In another example, red (R), green (G), and blue (B) subpixels may be spaced apart from each other to have a virtual triangular structure, as illustrated in FIG. 3B.

Each subpixel includes at least one of a thin-film transistor having an oxide semiconductor layer or a thin-film transistor having a polycrystalline semiconductor layer. The thin-film transistor having the oxide semiconductor layer and the thin-film transistor having the polycrystalline semiconductor layer have electron mobility higher than that of a thin-film transistor having an amorphous semiconductor layer, and enables realization of high resolution and low electric power.

At least one of the data-driving unit 204 or the scan-driving unit 202 may be disposed in the non-active area NA.

The scan-driving unit 202 drives scan lines of the display panel 200. The scan-driving unit 202 is formed using at least one of the thin-film transistor having the oxide semiconductor layer or the thin-film transistor having the polycrystalline semiconductor layer. Here, the thin-film transistor of the scan-driving unit 202 is formed simultaneously with at least one thin-film transistor, which is disposed in each subpixel of the active area AA, through the same process.

Figure 4B:
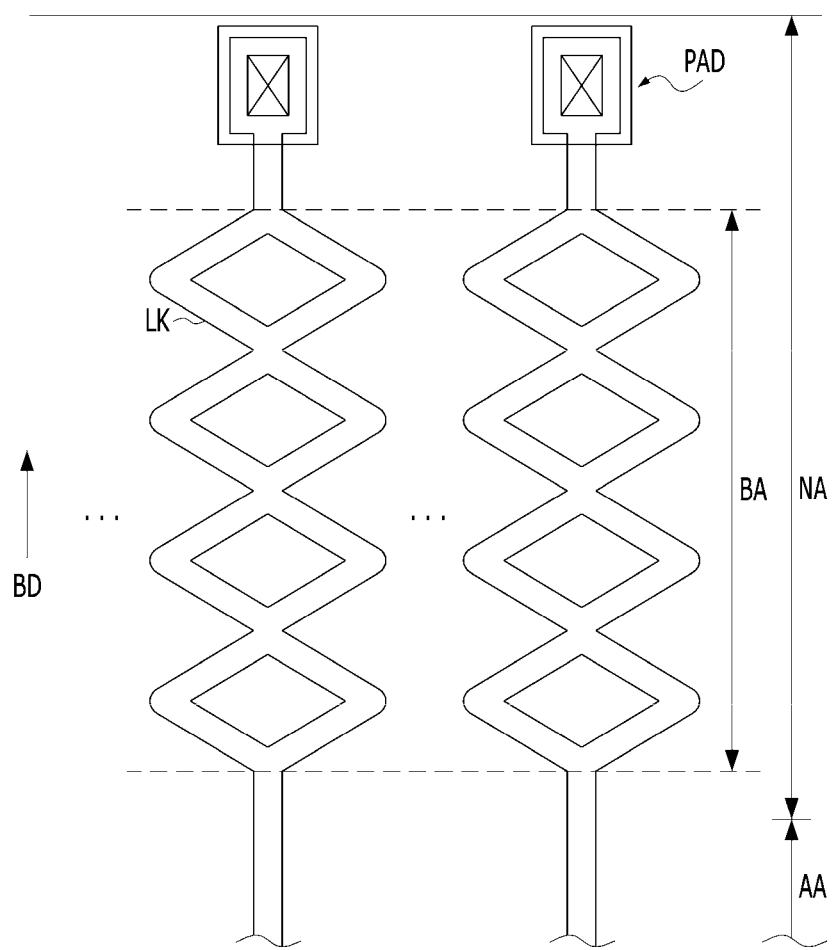

The data-driving unit 204 drives data lines of the display panel 200. The data-driving unit 204 may be mounted in a chip form on the substrate 101, or may be mounted in a chip form on a signal transmission film 206, so as to be attached to the non-active area NA of the display panel 200. A plurality of signal pads PAD are disposed in the non-active area NA, as illustrated in FIGS. 4A and 4B, in order to be electrically connected to the signal transmission film 206. Driving signals, generated in the data-driving unit 204, the scan-driving unit 202, a power supply unit (not illustrated), and a timing controller (not illustrated), are supplied to signal lines disposed in the active area AA through the signal pads PAD.

The non-active area NA includes a bending area BA, by which the display panel 200 is bendable or foldable. The bending area BA is an area that is bent in order to position a non-display area, including the signal pads PAD, the scan-driving unit 202, and the data-driving unit 204, on the rear surface of the active area AA. The bending area BA, as illustrated in FIG. 1, is disposed in an upper portion of the non-active area NA between the active area AA and the data-driving unit 204. Alternatively, the bending area BA may be disposed in at least one of an upper, lower, left, or right portion of the non-active area NA. Thereby, on the entire screen of the display device, the area occupied by the active area AA is maximized and the area occupied by the non-active area NA is minimized.

Signal links LK are disposed in the bending area BA to interconnect the signal pads PAD and the signal lines disposed in the active area AA. When the signal links LK are formed in straight lines along the bending direction BD, the greatest bending stress may be applied to the signal links LK, causing cracks or a short-circuit thereof. Therefore, in the present disclosure, the area of each signal link LK is increased in the direction crossing the bending direction BD so as to minimize bending stress. To this end, the signal links LK may be shaped to have a zigzag form or a sinusoidal form, as illustrated in FIG. 4A, or may take the form of a plurality of diamonds that have an empty central area and are connected to each other in a line form, as illustrated in FIG. 4B.

As illustrated in FIG. 2, at least one opening 212 is formed in the bending area BA so as to enable easy bending of the bending area BA. The opening 212 is formed by removing a plurality of inorganic insulation layers 210 disposed in the bending area BA, so that the signal links LK are formed on the substrate 101. Specifically, when the substrate 101 undergoes bending, continuous bending stress is applied to the inorganic insulation layers 210 disposed in the bending area BA. Since the inorganic insulation layers 210 have elasticity lower than that of an organic insulation material, cracks may be easily formed in the inorganic insulation layers 210. The cracks formed in the inorganic insulation layers 210 spread to the active area AA along the inorganic insulation layers 210, thus causing a line defect and an element driving defect. Therefore, the inorganic insulation layers 210 are removed from the bending area BA, and at least one planarization layer 208 is formed in the bending area BA using an organic insulation material having elasticity higher than that of the inorganic insulation layers 210. The planarization layer 208 may serve to alleviate bending stress caused upon bending of the substrate 101, thereby preventing the formation of cracks. The opening 212 in the bending area BA is formed through the same mask process as at least one contact hole, among a plurality of contact holes disposed in the active area AA, which may simplify the structure of the display device and the manufacturing process thereof.

The display device, which may simplify the structure and the manufacturing process thereof as described above, may be applied to a display device that requires thin-film transistors, such as a liquid crystal display device or an organic light-emitting display device. Hereinafter, an embodiment of the present disclosure in which the display device, which may simplify the structure and the manufacturing process, is applied to an organic light-emitting display device, will be described.

Figure 5A:
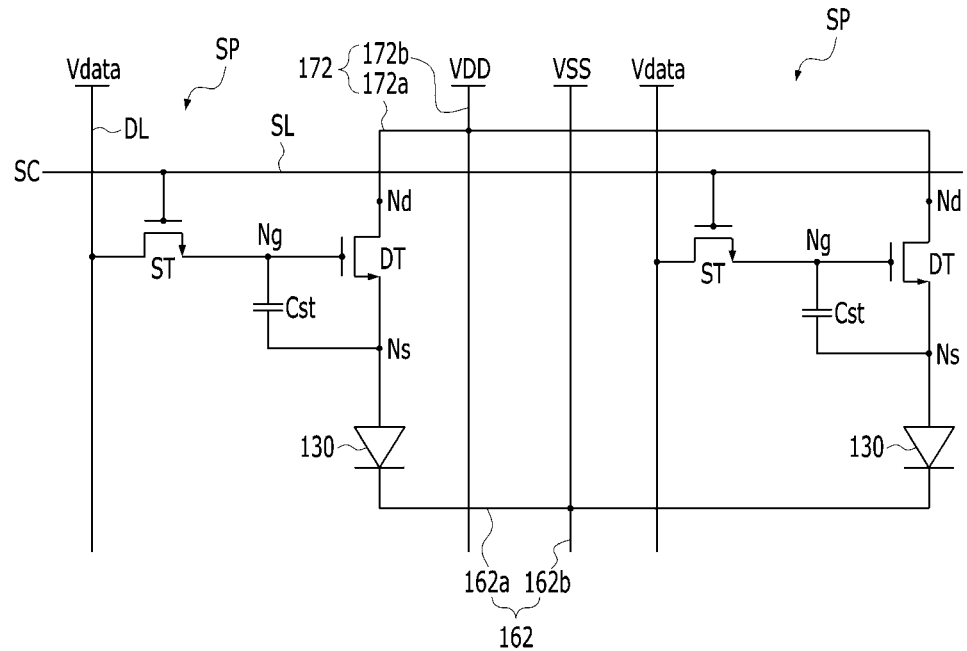
FIGS. 5A and 5B are circuit diagrams for explaining each subpixel of the display device illustrated in FIG. 1 according to the present disclosure.
Figure 5B:
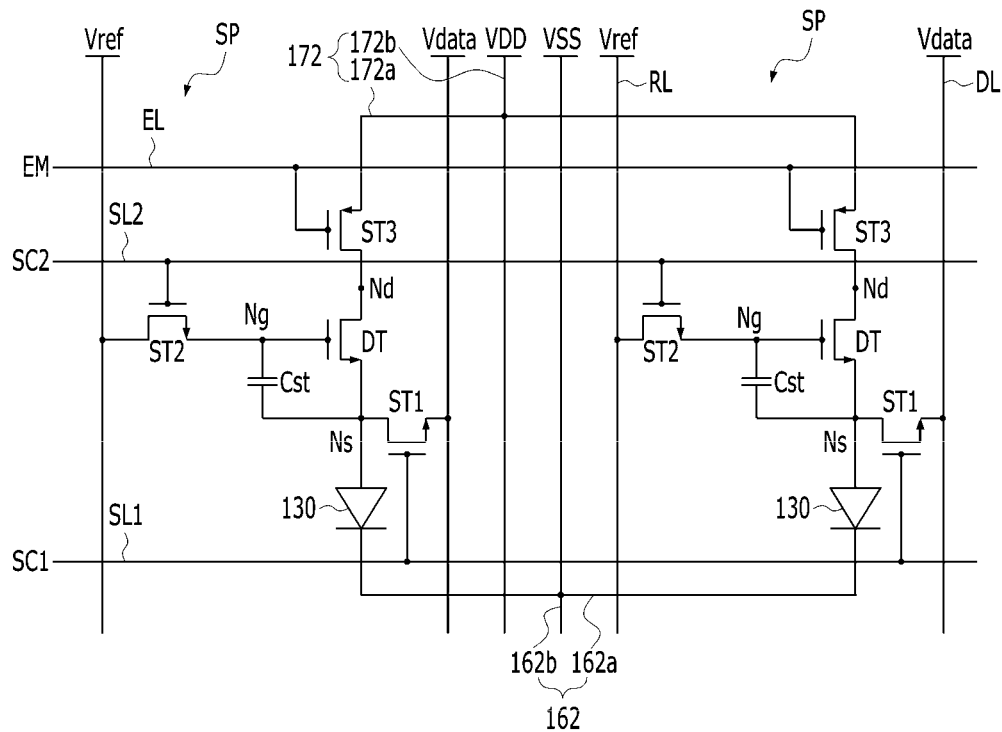

Each subpixel SP of the organic light-emitting display device, as illustrated in FIGS. 5A and 5B, includes a pixel-driving circuit and a light-emitting element 130 connected to the pixel-driving circuit.

The pixel-driving circuit may have a 2T1C structure including two thin-film transistors ST and DT and a single storage capacitor Cst, as illustrated in FIG. 5A, or may have a 4T1C structure including four thin-film transistors ST1, ST2, ST3 and DT and a single storage capacitor Cst, as illustrated in FIG. 5B. Here, the pixel-driving circuit is not limited to the structures of FIGS. 5A and 5B, and any of various other pixel-driving circuits may be used.

The storage capacitor Cst of the pixel-driving circuit illustrated in FIG. 5A is located between and connected to a gate node Ng and a source node Ns to maintain a constant voltage between the gate node Ng and the source node Ns. A driving transistor DT includes a gate electrode connected to the gate node Ng, a drain electrode connected to a drain node Nd, and a source electrode connected to the light-emitting element 130. The driving transistor DT controls the magnitude of driving current depending on the voltage between the gate node Ng and the source node Ns. A switching transistor ST includes a gate electrode connected to a scan line SL, a drain electrode connected to a data line DL, and a source electrode connected to the gate node Ng. The switching transistor ST is turned on in response to a scan control signal SC from the scan line SL, and supplies a data voltage Vdata from the data line DL to the gate node Ng. The light-emitting element 130 is located between and connected to the source node Ns, which is connected to the source electrode of the driving transistor DT, and a low-potential supply line 162 to emit light based on driving current.

The pixel-driving circuit illustrated in FIG. 5B has substantially the same configuration as the pixel-driving circuit illustrated in FIG. 5A, except that a drain electrode of a first switching transistor ST1 connected to the data line DL is connected to the source node Ns and that the pixel-driving circuit further includes second and third switching transistors ST2 and ST3. Thus, a detailed description related to the same configuration will be omitted.

Figure 6:
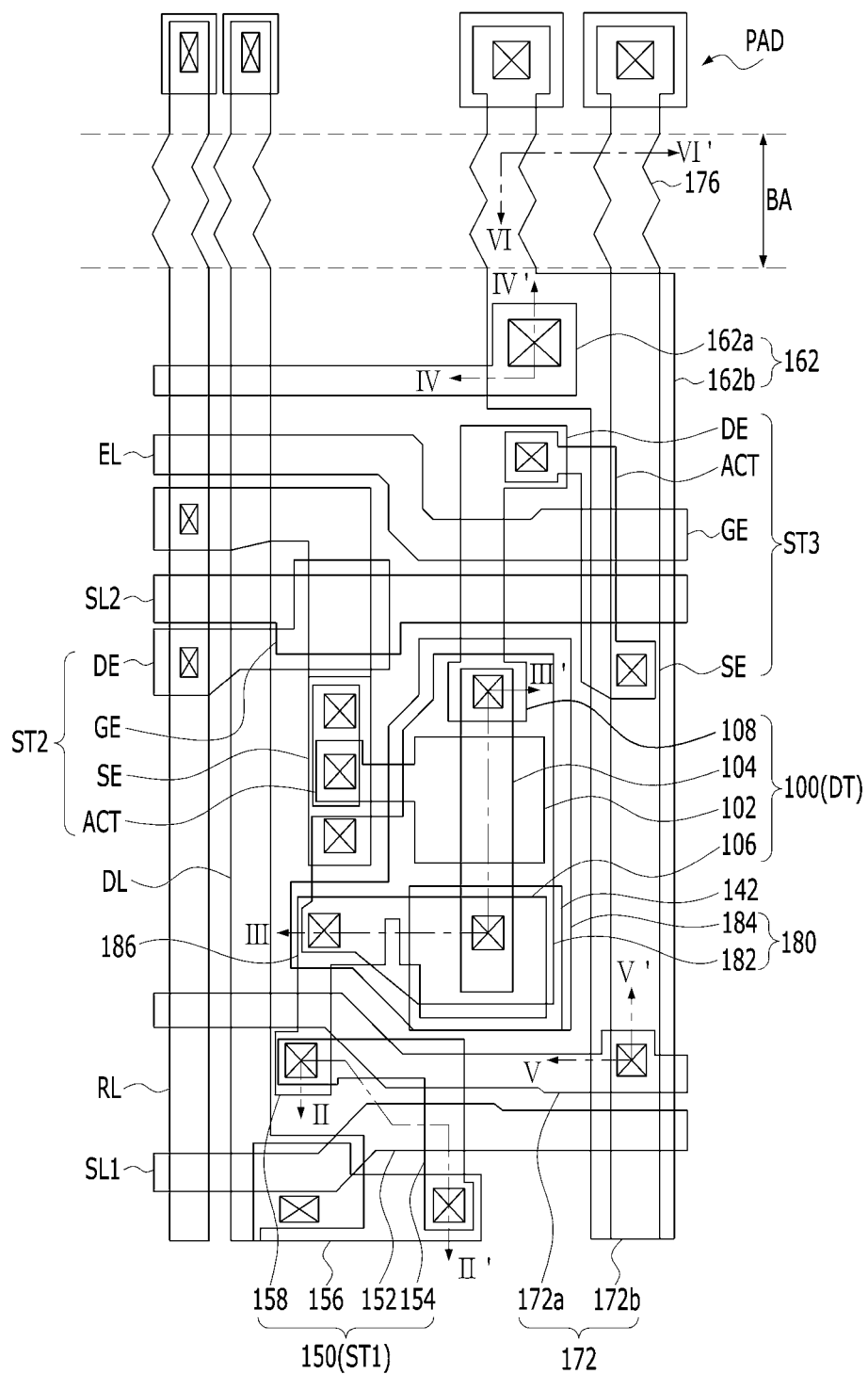
FIG. 6 is a plan view illustrating the subpixel illustrated in FIG. 5B according to the present disclosure.

The first switching transistor ST1 illustrated in FIGS. 5B and 6 includes a gate electrode 152 connected to a first scan line SL1, a drain electrode 158 connected to the source node Ns, a source electrode 156 connected to the data line DL, and a semiconductor layer 154 forming a channel between the source and drain electrodes 156 and 158. The first switching transistor ST1 is turned on in response to a scan control signal SC1 from the first scan line SL1, and supplies the data voltage Vdata from the data line DL to the source node Ns.

The second switching transistor ST2 includes a gate electrode GE connected to a second scan line SL2, a drain electrode DE connected to a reference line RL, a source electrode SE connected to the gate node Ng, and a semiconductor layer ACT forming a channel between the source and drain electrodes SE and DE. The second switching transistor ST2 is turned on in response to a scan control signal SC2 from the second scan line SL2, and supplies a reference voltage Vref from the reference line RL to the gate node Ng.

The third switching transistor ST3 includes a gate electrode GE connected to an emission control line EL, a drain electrode DE connected to the drain node Nd, a source electrode SE connected to a high-potential supply line 172, and a semiconductor layer ACT forming a channel between the source and drain electrodes SE and DE. The third switching transistor ST3 is turned on in response to an emission control signal EM from the emission control line EL, and supplies a high-potential voltage VDD from the high-potential supply line 172 to the drain node Nd.

Each of the high-potential supply line 172 and the low-potential supply line 162, included in the pixel-driving circuit described above, is formed to have a mesh shape so as to be shared by at least two subpixels. To this end, the high-potential supply line 172 includes first and second high-potential supply lines 172a and 172b crossing each other, and the low-potential supply line 162 includes first and second low-potential supply lines 162a and 162b crossing each other.

Each of the second high-potential supply line 172b and the second low-potential supply line 162b is disposed parallel to the data line DL, and is formed in a number of one for at least two subpixels. The second high-potential supply line 172b and the second low-potential supply line 162b may be disposed parallel to each other, as illustrated in FIGS. 5A and 5B, or may be disposed parallel to each other in the vertical direction so as to overlap each other, as illustrated in FIG. 6.

The first high-potential supply line 172a is electrically connected to the second high-potential supply lines 172b, and is disposed parallel to the scan line SL. The first high-potential supply line 172a is branched from the second high-potential supply line 172b so as to cross the second high-potential supply line 172b Thereby, the first high-potential supply line 172a may compensate for the resistance of the second high-potential supply line 172b, thereby minimizing the voltage drop (IR drop) of the high-potential supply line 172.

The first low-potential supply line 162a is electrically connected to the second low-potential supply lines 162b, and is disposed parallel to the scan line SL. The first low-potential supply line 162a is branched from the second low-potential supply line 162b so as to cross the second low-potential supply line 162b. Thereby, the first low-potential supply line 162a may compensate for the resistance of the second low-potential supply line 162b, thereby minimizing the voltage drop (IR drop) of the low-potential supply line 162.

Since the high-potential supply line 172 and the low-potential supply line 162 described above are formed to have a mesh shape, the number of second high-potential supply lines 172b and the number of second low-potential supply lines 162b, which are disposed in the vertical direction, may be reduced, and a greater number of subpixels may be disposed in proportion to an reduced in number of the second high-potential supply lines 172b and number of second low-potential supply lines 162b, which results in an increased aperture ratio and resolution.

One of the plurality of transistors included in the pixel-driving circuit described above includes a polycrystalline semiconductor layer, and the other transistor includes an oxide semiconductor layer.

Figure 7A:
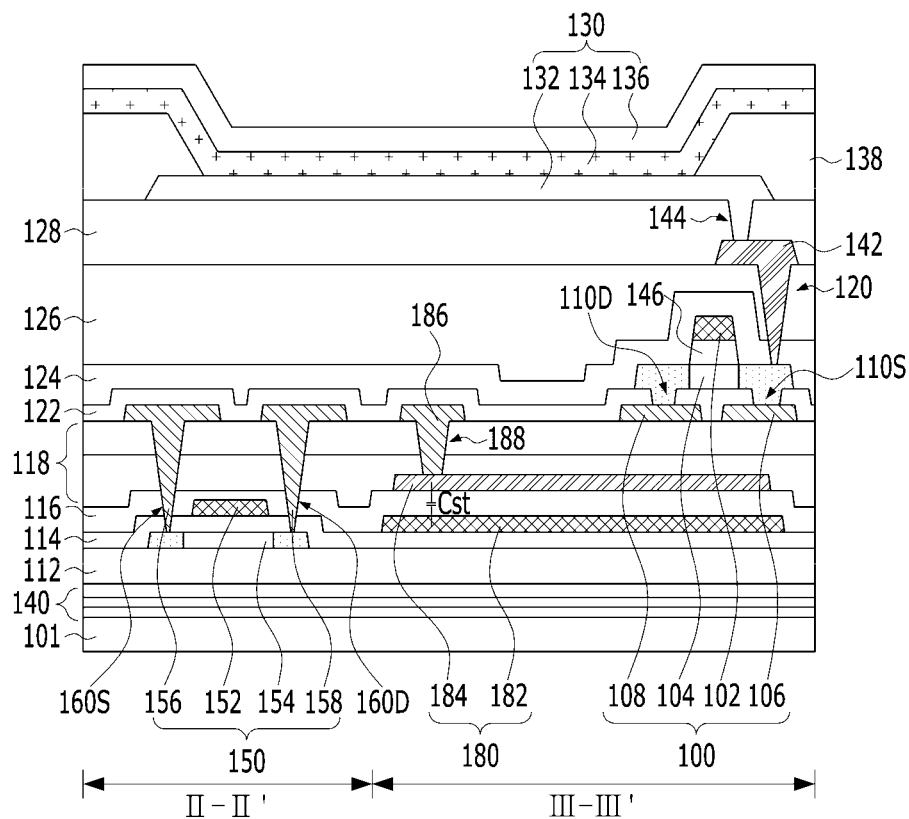
FIG. 7A is a cross-sectional view illustrating an organic light-emitting display device taken along lines "II-II'" and "III-III'" of FIG. 6
Figure 7B:
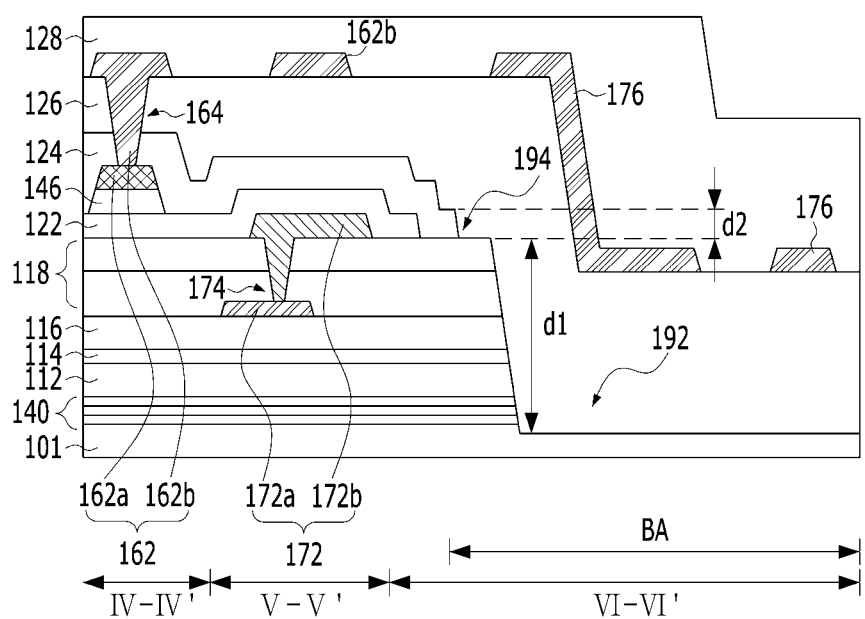
FIG. 7B is a cross-sectional view illustrating an organic light-emitting display device taken along lines "IV-IV'", "V-V'", and "VI-VI'" of FIG. 6 according to the present disclosure.

For example, as illustrated in FIGS. 7A and 7B, the switching transistor ST of the pixel-driving circuit illustrated in FIG. 5A is configured as a first thin-film transistor 150 having a polycrystalline semiconductor layer 154, and the driving transistor DT is configured as a second thin-film transistor 100 having an oxide semiconductor layer 104. Then, each of the first and third switching transistors ST1 and ST3 of the pixel-driving circuit illustrated in FIGS. 5B and 6 is configured as the first thin-film transistor 150 having the polycrystalline semiconductor layer 154, and each of the second switching transistor ST2 and the driving transistor DT is configured as the second thin-film transistor 100 having the oxide semiconductor layer 104. As such, the present disclosure may reduce power consumption by using the second thin-film transistor 100 having the oxide semiconductor layer 104 as the driving transistor DT of each subpixel and using the first thin-film transistor 150 having the polycrystalline semiconductor layer 154 as the switching transistor ST of each subpixel.

The first thin-film transistor 150 illustrated in FIGS. 6 and 7 includes the polycrystalline semiconductor layer 154, a first gate electrode 152, a first source electrode 156, and a first drain electrode 158.

The polycrystalline semiconductor layer 154 is formed on a lower buffer layer 112. The polycrystalline semiconductor layer 154 includes a channel area, a source area, and a drain area. The channel area overlaps the first gate electrode 152 with a lower gate insulation layer 114 interposed therebetween, so that the channel area is formed between the first source electrode 156 and the first drain electrode 158. The source area is electrically connected to the first source electrode 156 through a first source contact hole 160S. The drain area is electrically connected to the first drain electrode 158 through a first drain contact hole 160D. Since the polycrystalline semiconductor layer 154 has mobility higher than that of an amorphous semiconductor layer and the oxide semiconductor layer 104, and exhibits low power consumption and high reliability, the polycrystalline semiconductor layer 154 is suitable for application to the scan-driving unit 202, which drives the switching transistor ST and the scan line SL of each subpixel. A multilayered buffer layer 140 and the lower buffer layer 112 are disposed between the polycrystalline semiconductor layer 154 and the substrate 101. The multilayered buffer layer 140 delays the diffusion of moisture and/or oxygen introduced into the substrate 101. The multilayered buffer layer 140 is formed by alternately stacking a silicon nitride (SiNx) and a silicon oxide (SiOx) at least one time. The lower buffer layer 112 functions to protect the polycrystalline semiconductor layer 154 and to block various kinds of defective materials introduced from the substrate 101. The lower buffer layer 112 may be formed of a-Si, a silicon nitride (SiNx), a silicon oxide (SiOx), or the like.

The first gate electrode 152 is formed on the lower gate insulation layer 114. The first gate electrode 152 overlaps the channel area of the polycrystalline semiconductor layer 154 with the lower gate insulation layer 114 interposed there between. The first gate electrode 152 may be formed in a single layer or in multiple layers using the same material as a lower storage electrode 182, for example, one of molybdenum (Mo), aluminum (Al), chrome (Cr), gold (Au), titanium (Ti), nickel (Ni), neodymium (Nd), and copper (Cu), or an alloy thereof, without being limited thereto.

First and second lower interlayer insulation layers 116 and 118 located on the polycrystalline semiconductor layer 154 are configured as inorganic layers having a higher content of hydrogen than that in an upper interlayer insulation layer 124. For example, the first and second lower interlayer insulation layers 116 and 118 are formed of a silicon nitride (SiNx) through a deposition process using $NH_3$ gas, and the upper interlayer insulation layer 124 is formed of a silicon oxide (SiOx). Hydrogen atoms included in the first and second lower interlayer insulation layers 116 and 118 are diffused to the polycrystalline semiconductor layer 154 during a hydrogenation process so that pores in the polycrystalline semiconductor layer 154 are filled with hydrogen. Thereby, the polycrystalline semiconductor layer 154 may be stabilized, which may prevent deterioration in the characteristics of the first thin-film transistor 150.

The first source and first drain electrodes 156 and 158 are disposed below the oxide semiconductor layer 104. The first source electrode 156 is connected to the source area of the polycrystalline semiconductor layer 154 through the first source contact hole 160S, which is formed in the first and second lower interlayer insulation layers 116 and 118. The first drain electrode 158 is disposed so as to face the first source electrode 156, and is connected to the drain area of the polycrystalline semiconductor layer 154 through the first drain contact hole 160D, which is formed in the lower gate insulation layer 114 and the first and second lower interlayer insulation layers 116 and 118. Since the first source and first drain electrodes 156 and 158 are formed in the same plane as a storage supply line 186 using the same material as the storage supply line 186, the first source and first drain electrodes 156 and 158 may be formed simultaneously with the storage supply line 186 through the same mask process.

After activation and hydrogenation processes of the polycrystalline semiconductor layer 154 of the first thin-film transistor 150, the oxide semiconductor layer 104 of the second thin-film transistor 100 is formed. That is, the oxide semiconductor layer 104 is located on the polycrystalline semiconductor layer 154. Thereby, since the oxide semiconductor layer 104 is not exposed to a high-temperature atmosphere in the activation and hydrogenation processes of the polycrystalline semiconductor layer 154, it is possible to prevent damage to the oxide semiconductor layer 104, which results in increased reliability.

The second thin-film transistor 100 is disposed on the second lower interlayer insulation layer 118 so as to be spaced apart from the first thin-film transistor 150. The second thin-film transistor 100 includes a second gate electrode 102, the oxide semiconductor layer 104, a second source electrode 106, and a second drain electrode 108.

The second gate electrode 102 overlaps the oxide semiconductor layer 104 with an upper gate insulation pattern 146 interposed there between. The second gate electrode 102 is formed on the upper gate insulation pattern 146, which is the same plane as the first low-potential supply line 162a, using the same material as the first low-potential supply line 162a. Thereby, the second gate electrode 102 and the first low-potential supply line 162a may be formed through the same mask process, which may reduce the number of mask processes.

The oxide semiconductor layer 104 is formed on an upper buffer layer 122 so as to overlap the second gate electrode 102, thereby forming a channel between the second source and second drain electrodes 106 and 108. The oxide semiconductor layer 104 is formed of an oxide including at least one metal selected from among the group consisting of Zn, Cd, Ga, In, Sn, Hf, and Zr. Since the second thin-film transistor 100 including the oxide semiconductor layer 104 has lower leakage current than the first thin-film transistor 150 including the polycrystalline semiconductor layer 154, the second thin-film transistor 100 may be applied to the switching transistor ST and the driving transistor DT, which keep a short on-time and a long off-time.

The upper interlayer insulation layer 124 and the upper buffer layer 122, which are close to the top and the bottom of the oxide semiconductor layer 104, are configured as inorganic layers having a lower content of hydrogen than that in the lower interlayer insulation layers 116 and 118. For example, the upper interlayer insulation layer 124 and the upper buffer layer 122 are formed of a silicon oxide (SiOx), and the lower interlayer insulation layers 116 and 118 are formed of a silicon nitride (SiNx). Thereby, it is possible to prevent hydrogen atoms in the lower interlayer insulation layers 116 and 118 and hydrogen atoms in the polycrystalline semiconductor layer 154 from being diffused to the oxide semiconductor layer 104 during a thermal treatment process of the oxide semiconductor layer 104.

The second source and second drain electrodes 106 and 108 are disposed below the oxide semiconductor layer 104. The second source and second drain electrodes 106 and 108 may be formed in a single layer or in multiple layers on the second lower interlayer insulation layer 118 using one of molybdenum (Mo), aluminum (Al), chrome (Cr), gold (Au), titanium (Ti), nickel (Ni), neodymium (Nd), and copper (Cu), or an alloy thereof, without being limited thereto.

The second source electrode 106 is exposed through a second source contact hole 110S formed in the upper buffer layer 122, and is connected to a source area of the oxide semiconductor layer 104. The second drain electrode 108 is exposed through a second drain contact hole 110D formed in the upper buffer layer 122, and is connected to a drain area of the oxide semiconductor layer 104. The second source and second drain electrodes 106 and 108 are formed so as to face each other with a channel area of the oxide semiconductor layer 104.

The storage capacitor Cst or 180, as illustrated in FIG. 7, is formed in a manner such that the lower storage electrode 182 and a upper storage electrode 184 overlap each other with the first lower interlayer insulation layer 116 interposed therebetween.

The lower storage electrode 182 is connected to one of the second gate electrode 102 of the driving transistor DT and the second source electrode 106 of the driving transistor DT. The lower storage electrode 182 is formed on the lower gate insulation layer 114 so as to overlap the oxide semiconductor layer 104 with a width similar to that of the oxide semiconductor layer 104, thereby preventing external light from being incident on the oxide semiconductor layer 104. The lower storage electrode 182 is located on the lower gate insulation layer 114 and is formed on the same layer as the first gate electrode 152 using the same material as the first gate electrode 152.

The upper storage electrode 184 is connected to the other one of the second gate electrode 102 of the driving transistor DT and the second source electrode 106 of the driving transistor DT via the storage supply line 186. The upper storage electrode 184 is formed on the first lower interlayer insulation layer 116 so as to overlap the oxide semiconductor layer 104 with a width similar to that of the oxide semiconductor layer 104, thereby preventing external light from being incident on the oxide semiconductor layer 104. The upper storage electrode 184 is located on the same layer as the first high-potential supply line 172a using the same material as the first high-potential supply line 172a. The upper storage electrode 184 is exposed through a storage contact hole 188 formed in the second lower interlayer insulation layer 118, and is connected to the storage supply line 186.

The first lower interlayer insulation layer 116, disposed between the lower storage electrode 182 and the upper storage electrode 184, is formed of an inorganic insulation material such as SiOx or SiNx. The first lower interlayer insulation layer 116 may be formed of SiNx having a dielectric constant higher than that of SiOx. Thereby, the lower storage electrode 182 and the upper storage electrode 184 overlap each other, with the first lower interlayer insulation layer 116, which is formed of SiNx having a high dielectric constant, therebetween, which causes an increase in the capacitance of the storage capacitor Cst that is proportional to the dielectric constant.

The light-emitting element 130 includes an anode electrode 132 connected to the second source electrode 106, at least one emission stack 134 formed on the anode electrode 132, and a cathode electrode 136 formed on the emission stack 134.

The anode electrode 132 is connected to a pixel connection electrode 142, which is exposed through a second pixel contact hole 144 formed in a second planarization layer 128. Here, the pixel connection electrode 142 is connected to the oxide semiconductor layer 104, which is exposed through the first pixel contact hole 120 formed in the first planarization layer 126 and the upper interlayer insulation layer 124.

The anode electrode 132 is formed to have a multilayered structure including a transparent conductive layer and an opaque conductive layer having high reflection efficiency. The transparent conductive layer is formed of a material having a relatively large work function value, such as indium-tin-oxide (ITO) or indium-zinc-oxide (IZO). The opaque conductive layer is formed in a single layer or in multiple layers using Al, Ag, Cu, Pb, Mo, Ti, or an alloy thereof. For example, the anode electrode 132 may be formed in a manner such that a transparent conductive layer, an opaque conductive layer, and a transparent conductive layer are sequentially stacked, or may be formed in a manner such that a transparent conductive layer and an opaque conductive layer are sequentially stacked. The anode electrode 132 is disposed on the second planarization layer 128 so as to overlap not only a light-emitting area provided by a bank 138 but also a circuit area in which the first and second thin-film transistors 150 and 100 and the storage capacitor (Cst) 180 are disposed, which increases a light-emitting area.

The emission stack 134 is formed by stacking a hole-related layer, an organic emission layer, and an electron-related layer on the anode electrode 132 in this order or in reverse order. Alternatively, the emission stack 134 may include first and second emission stacks, which face each other with a charge generation layer interposed therebetween. In this case, the organic emission layer of one of the first and second emission stacks generates blue light and the organic emission layer of the other one of the first and second emission stacks generates yellow-green light, whereby white light is generated by the first and second emission stacks. When the white light generated in the emission stack 134 is incident on a color filter (not illustrated), which is located on the emission stack 134, a color image may be formed. Alternatively, a color image may be formed without a separate color filter when each emission stack 134 generates colored light corresponding to each subpixel. That is, the emission stack 134 of a red (R) subpixel may generate red light, the emission stack 134 of a green (G) subpixel may generate green light, and the emission stack 134 of a blue (B) subpixel may generate blue light.

The bank 138 is formed so as to expose the anode electrode 132 of each subpixel. The bank 138 may be formed of an opaque material (e.g. black carbon) in order to prevent optical interference between adjacent subpixels. In this case, the bank 138 includes a light-blocking material containing at least one of a color pigment or organic black carbon.

The cathode electrode 136 is formed on the upper surface and the side surface of the emission stack 134 so as to face the anode electrode 132 with the emission stack 134 interposed therebetween. When the cathode electrode 136 is applied to a top-emission-type organic light-emitting display device, it is formed of a transparent conductive layer, such as indium-tin-oxide (ITO) or indium-zinc-oxide (IZO).

The cathode electrode 136 is electrically connected to the low-potential supply line 162. The low-potential supply line 162, as illustrated in FIGS. 5B and 6, include the first and second low-potential supply lines 162a and 162b crossing each other. The first low-potential supply line 162a, as illustrated in FIG. 7, is formed on the upper gate insulation pattern 146, which is the same layer as the second gate electrode 102, using the same material as the second gate electrode 102. The second low-potential supply line 162b is formed on the first planarization layer 126, which is the same layer as the pixel connection electrode 142, using the same material as the pixel connection electrode 142. The second low-potential supply line 162b is electrically connected to the first low-potential supply line 162a, which is exposed through a first line contact hole 164 formed in the upper interlayer insulation layer 124 and the first planarization layer 126.

The high-potential supply line 172, which supplies a high-potential voltage VDD higher than a low-potential voltage VSS supplied through the low-potential supply line 162, as illustrated in FIGS. 5B and 6, include the first and second high-potential supply lines 172a and 172b. The first high-potential supply line 172a, as illustrated in FIG. 7, is formed on the first lower interlayer insulation layer 116, which is the same layer as the upper storage electrode 184, using the same material as the upper storage electrode 184. The second high-potential supply line 172b is formed on the second lower interlayer insulation layer 118, which is the same layer as the second source and second drain electrodes 106 and 108, using the same material as the second source and second drain electrodes 106 and 108. The second high-potential supply line 172b is electrically connected to the first high-potential supply line 172a, which is exposed through a second line contact hole 174 formed in the second lower interlayer insulation layer 118.

Here, the second low-potential supply line 162b and the second high-potential supply line 172b vertically overlap each other with the upper buffer layer 122, the upper interlayer insulation layer 124, and the first planarization layer 126 interposed there between. In this case, even if micro-bubbles are formed in the first planarization layer 126 during a coating process of the first planarization layer 126 formed of an organic insulation material, the second low-potential supply line 162b and the second high-potential supply line 172b are electrically insulated from each other by the upper buffer layer 122 formed of an inorganic insulation material and the upper interlayer insulation layer 124, which are disposed between the second low-potential supply line 162b and the second high-potential supply line 172b. Thus, it is possible to prevent a short-circuit between the second low-potential supply line 162b and the second high-potential supply line 172b by the upper buffer layer 122 and the upper interlayer insulation layer 124.

A signal link 176, which is connected to at least one of the low-potential supply line 162, the high-potential supply line 172, the data line DL, the scan line SL, the reference line RL, or the emission control line EL, is formed so as to traverse the bending area BA in which first and second openings 192 and 194 are located. The first opening 192 is formed so as to expose the side surface of each of the multilayered buffer layer 140, the lower buffer layer 112, the lower gate insulation layer 114, and the first and second lower interlayer insulation layers 116 and 118. The first opening 192 is formed through the same mask process as the first source contact hole 160S and the first drain contact hole 160D. Thus, the first opening 192 may be formed to have a depth d1, which is equal to or greater than that of at least one of the first source contact hole 160S or the first drain contact hole 160D. The second opening 194 exposes the side surface of the upper interlayer insulation layer 124, and thus has a second depth D2, which is smaller than the first depth d1. The second opening 194 is formed through the same mask process as the first pixel contact hole 120 formed in the upper interlayer insulation layer 124. Thus, the second opening 194 has the same depth d2 as the first pixel contact hole 120 formed in the upper interlayer insulation layer 124.

Figure 8A:
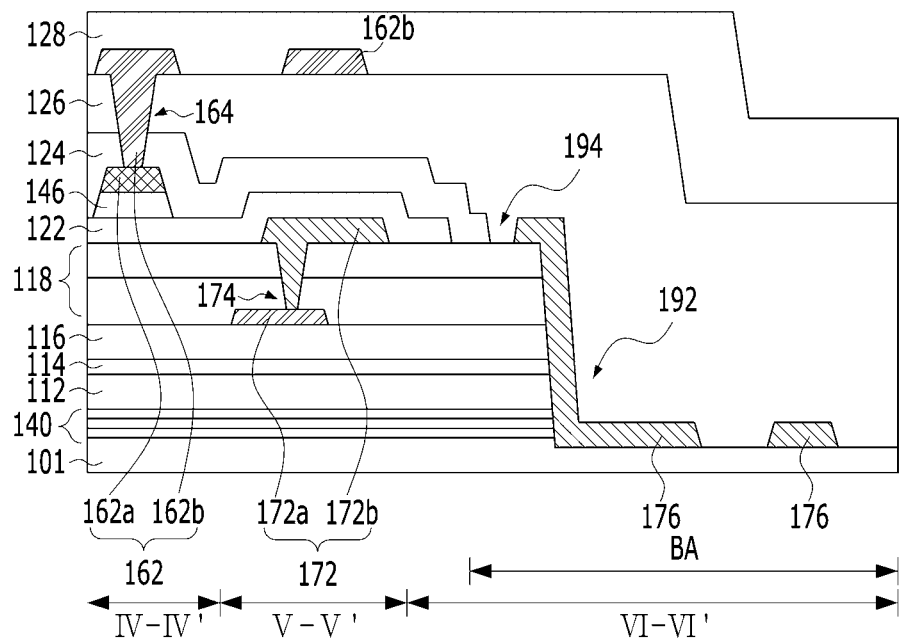
FIGS. 8A and 8B are cross-sectional views illustrating other embodiments of the bending area illustrated in FIG. 7 according to the present disclosure.
Figure 8B:
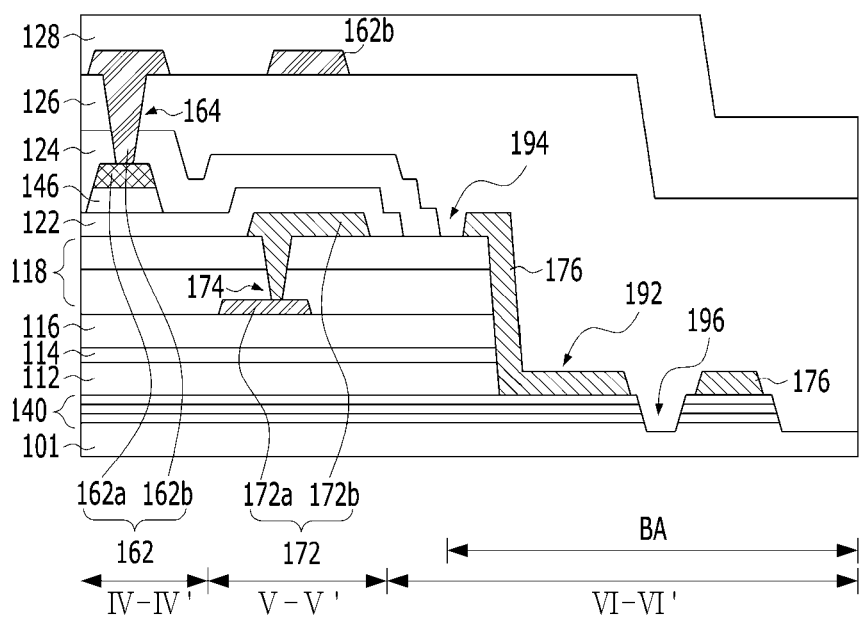

The signal link 176, as illustrated in FIG. 7, may be formed together with the pixel connection electrode 142 through the same mask process as the pixel connection electrode 142. In this case, the signal link 176 is formed in the same plane as the pixel connection electrode 142, i.e. on the first planarization layer 126, using the same material as the pixel connection electrode 142. The second planarization layer 128 may be disposed on the signal link 176 so as to cover the signal link 176 formed on the first planarization layer 126. Alternatively, an encapsulation film or an inorganic encapsulation layer, which takes the form of an encapsulation stack including inorganic and organic encapsulation layers, is disposed without the second planarization layer 128. The signal link 176, as illustrated in FIGS. 8A and 8B, may be formed together with the source and drain electrodes 106, 156, 108 and 158 through the same mask process as the source and drain electrodes 106, 156, 108 and 158. In this case, the signal link 176 is formed in the same plane as the source and drain electrodes 106, 156, 108 and 158, i.e. on the second lower interlayer insulation layer 118 using the same material as the source and drain electrodes 106, 156, 108 and 158, and is also formed on the substrate 101 so as to come into contact with the substrate 101. At least one of the first or second planarization layer 126 or 128 may be disposed on the signal link 176, or an encapsulation film or an inorganic encapsulation layer, which takes the form of an encapsulation stack including inorganic and organic encapsulation layers, is disposed without the first and second planarization layers 126 and 128, so as to cover the signal link 176 formed on the second lower interlayer insulation layer 118 and the substrate 101. As illustrated in FIG. 8A, the signal link 176 is formed on the side surfaces of the multilayered buffer layer 140, the lower buffer layer 112, the lower gate insulation layer 114, and the first and second lower interlayer insulation layers 116 and 118, which are exposed by the first opening 192, on the side surface of the upper interlayer insulation layer 124 exposed by the second opening 194, and on the upper surface of the second lower interlayer insulation layer 118, and therefore, is formed in a stepped shape. At least one moisture-blocking hole (not illustrated) may be formed in the first and second planarization layers 126 and 128 in the bending area BA. The moisture-blocking hole is formed in at least one of a position between the signal links 176 or a position above the signal links 176. The moisture-blocking hole prevents moisture from the outside from being introduced into the active area AA through at least one of the first or second planarization layer 126 or 128, which is disposed on the signal links 176.

The signal links 176 are disposed on the substrate 101, which is exposed by the first opening 192, in the bending area BA, and at least one of the first or second planarization layer 126 or 128 is disposed on the signal links 176. Thereby, the multilayered buffer layer 140, the lower buffer layer 112, the lower gate insulation layer 114, the first and second lower interlayer insulation layers 116 and 118, and the upper interlayer insulation layer 124 are removed through the first and second openings 192 and 194 in the bending area BA. That is, when a plurality of inorganic insulation layers 140, 112, 114, 116, 118, 122 and 124, which cause cracks, are removed from the bending area BA, the substrate 101 may be easily bent without generation of cracks. The signal links 176, as illustrated in FIG. 8B, may be disposed on the multilayered buffer layer 140. Here, when the multilayered buffer layer 140, disposed between the signal links 176, is removed so as to secure easy bending without generation of cracks, a trench 196 is formed between the signal links 176 so as to expose the substrate 101. An inspection line (not illustrated), which is used during an inspection process, is formed to have the same structure as one of the signal links 176 illustrated in FIGS. 7 to 8B.

The first opening 192 is formed in the bending area by removing the organic insulation layers disposed below the upper buffer layer 122, i.e. the multilayered buffer layer 140, the lower buffer layer 112, the lower gate insulation layer 114, and the first and second lower interlayer insulation layers 116 and 118. Thereby, since the depth of the first opening 192 of the present disclosure is smaller than that in a comparative example in which the first opening is formed by removing the inorganic insulation layers disposed below the first planarization layer 126, the side surfaces of the inorganic insulation layers 140, 112, 114, 116 and 118, which are exposed by the first opening 192, have a gentle inclination angle. Thereby, the step coverage of the signal links 176 formed on the side surfaces of the inorganic insulation layers 140, 112, 114, 116 and 118, which are exposed by the first opening 192, as well as inspection lines (not illustrated) disposed in the non-active area NA is improved. Accordingly, it is possible to prevent the residue or open defects of the signal links 176 and the inspection lines when the signal links 176 and the inspection lines are formed on the side surfaces of the inorganic insulation layers 140, 112, 114, 116 and 118 in the bending area BA.

Figure 9A:
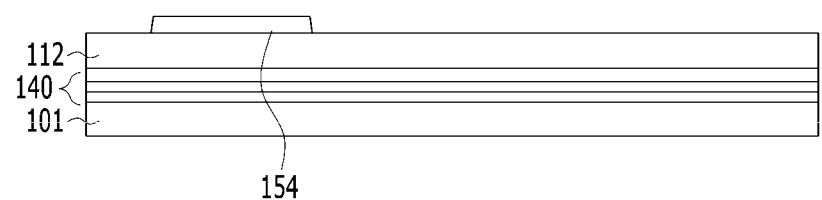
FIGS. 9A to 9N are cross-sectional views for explaining a method of manufacturing the organic light-emitting display device illustrated in FIGS. 7A and 7B according to the present disclosure.
Figure 9A:
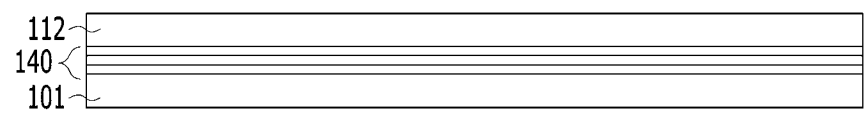
Figure 9B:
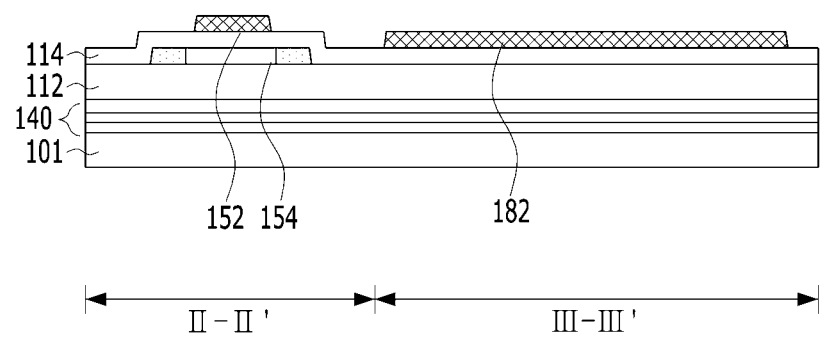
Figure 9B:
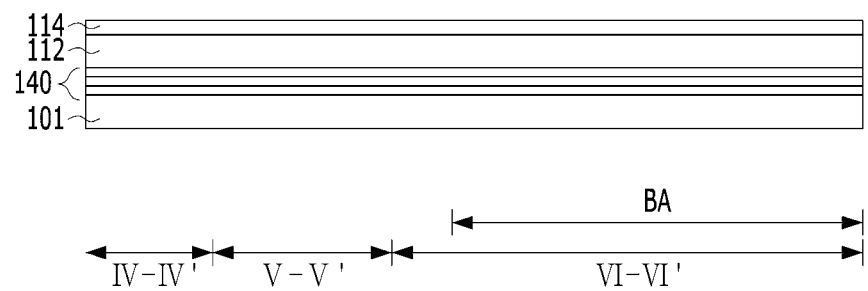
Figure 9C:
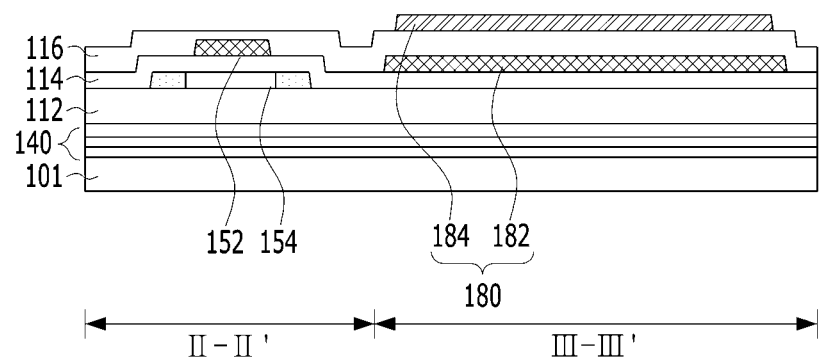
Figure 9C:
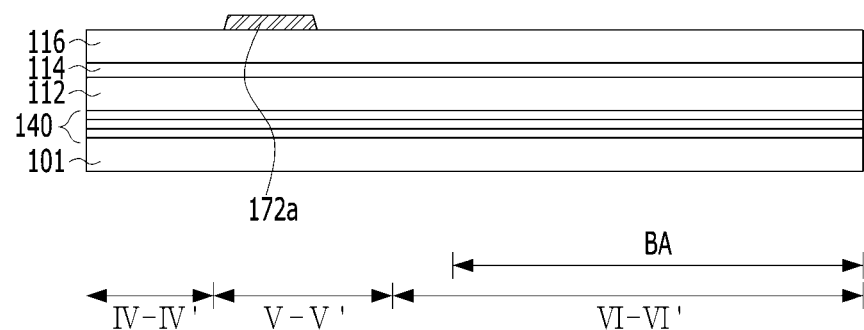
Figure 9D:
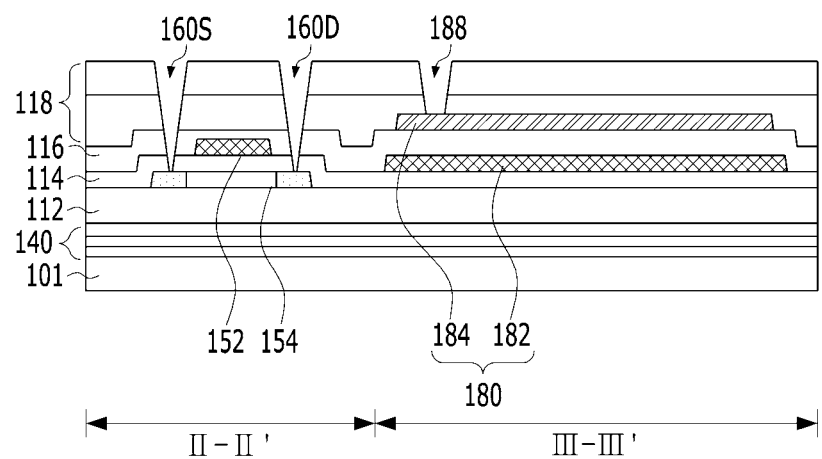
Figure 9D:
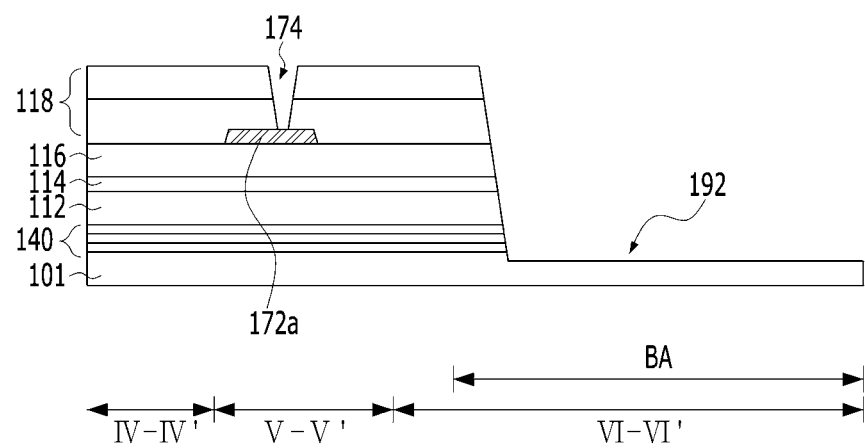
Figure 9E:
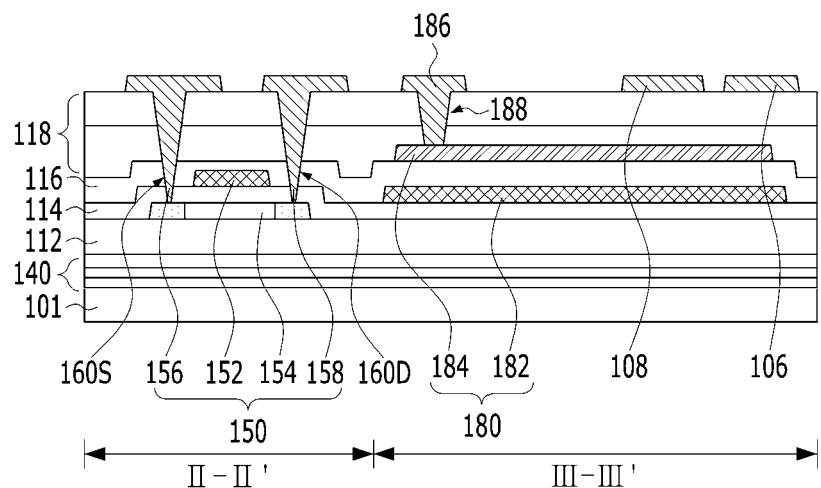
Figure 9E:
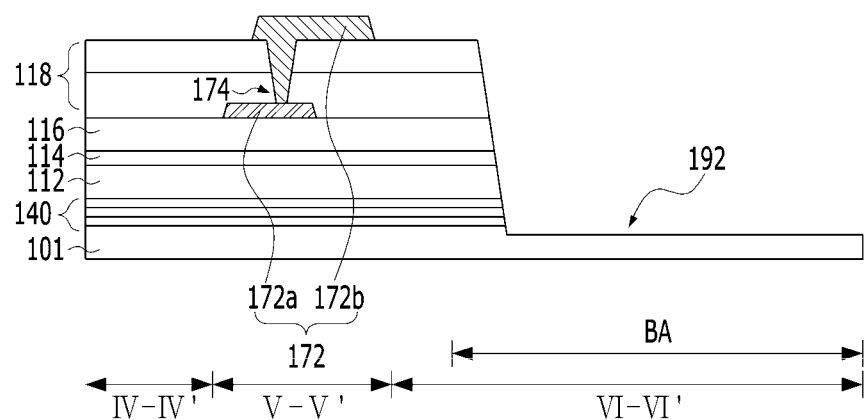
Figure 9F:
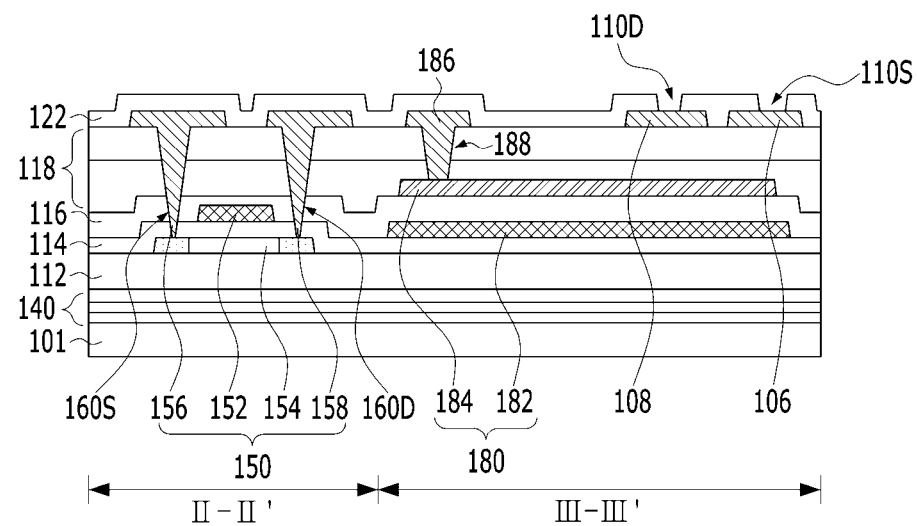
Figure 9F:
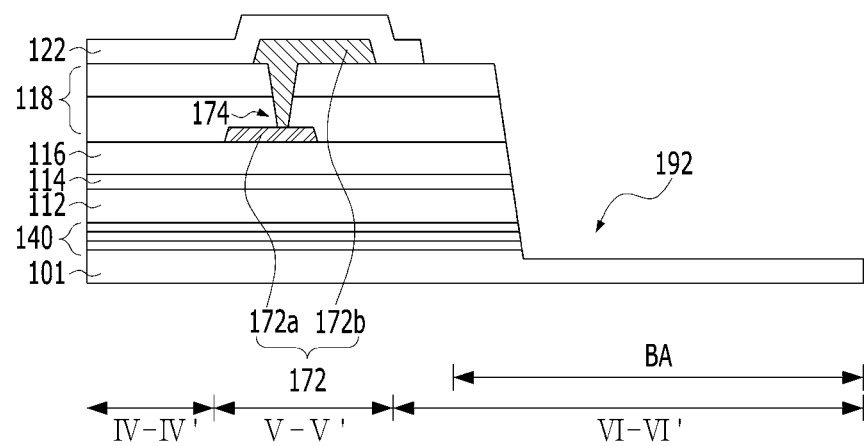
Figure 9G:
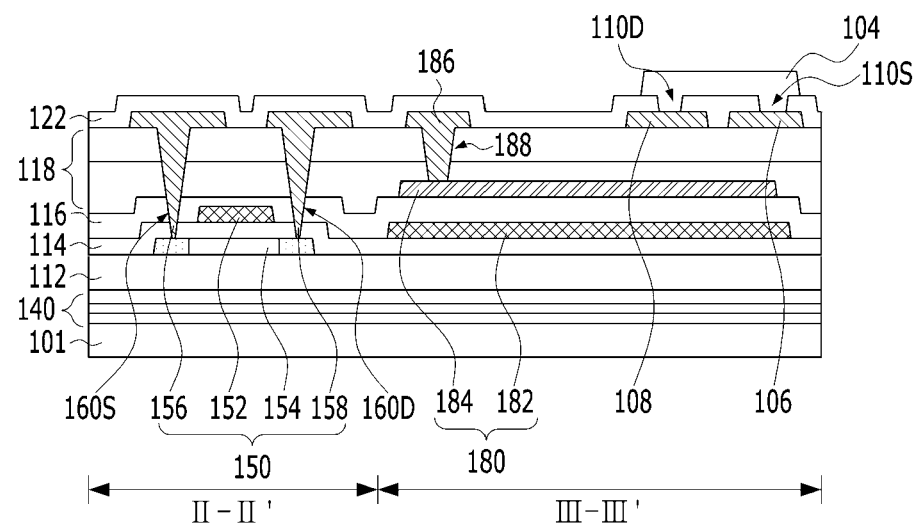
Figure 9G:
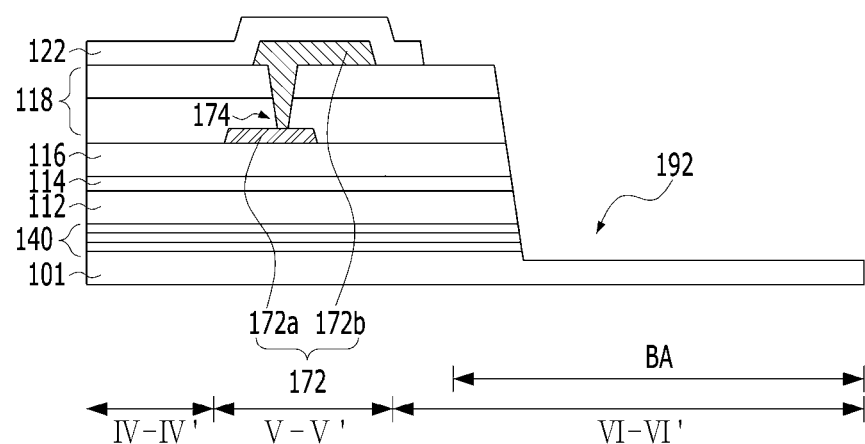
Figure 9H:
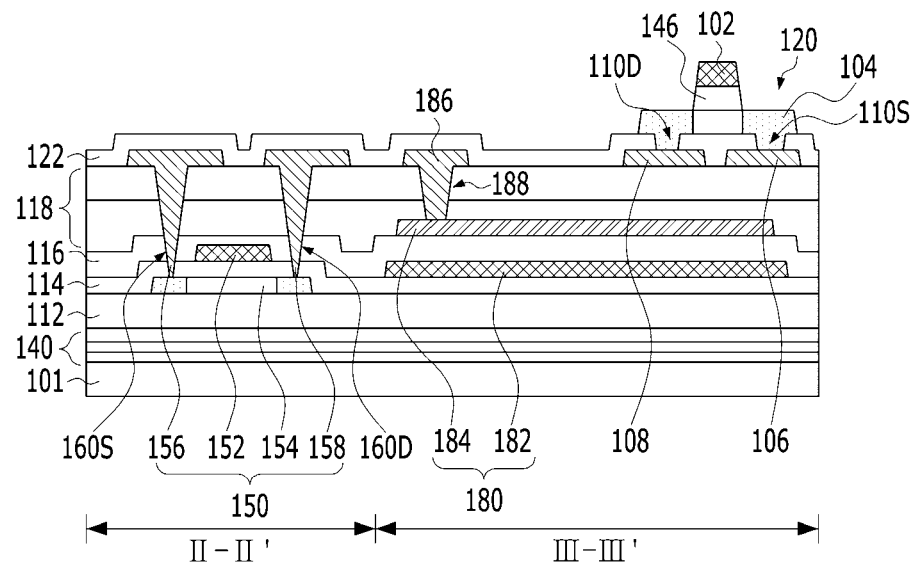
Figure 9H:
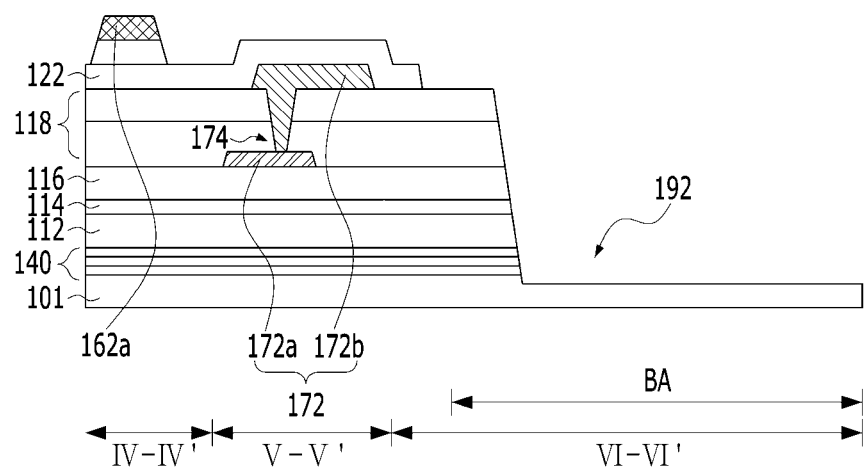
Figure 9I:
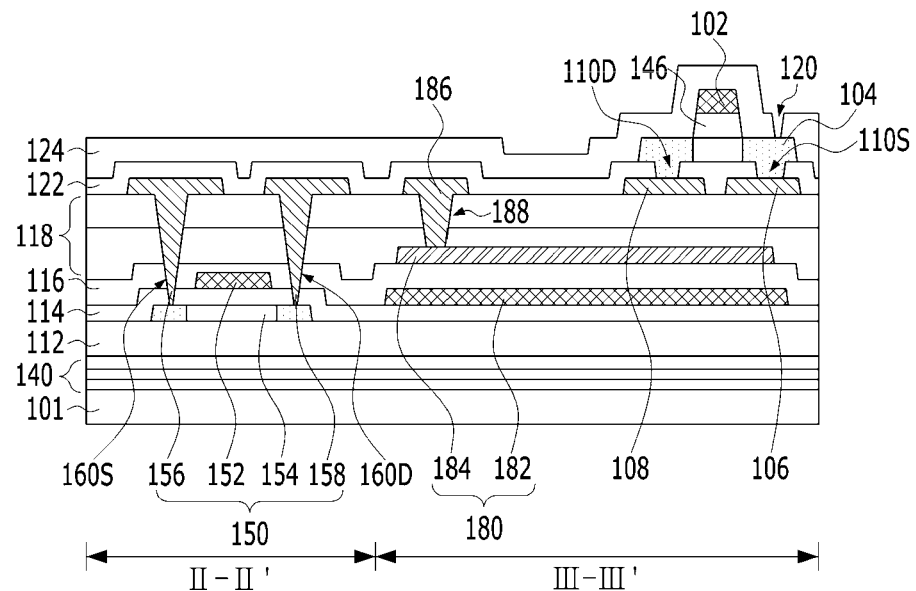
Figure 9I:
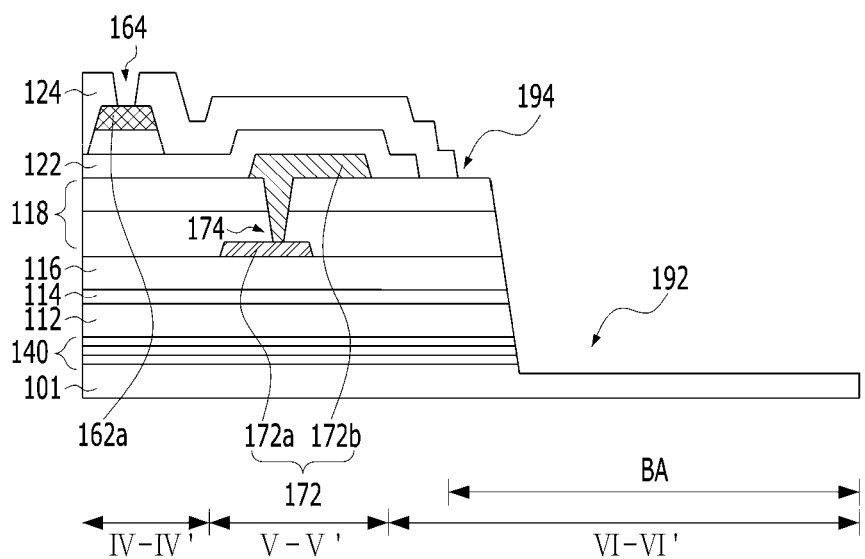
Figure 9J:
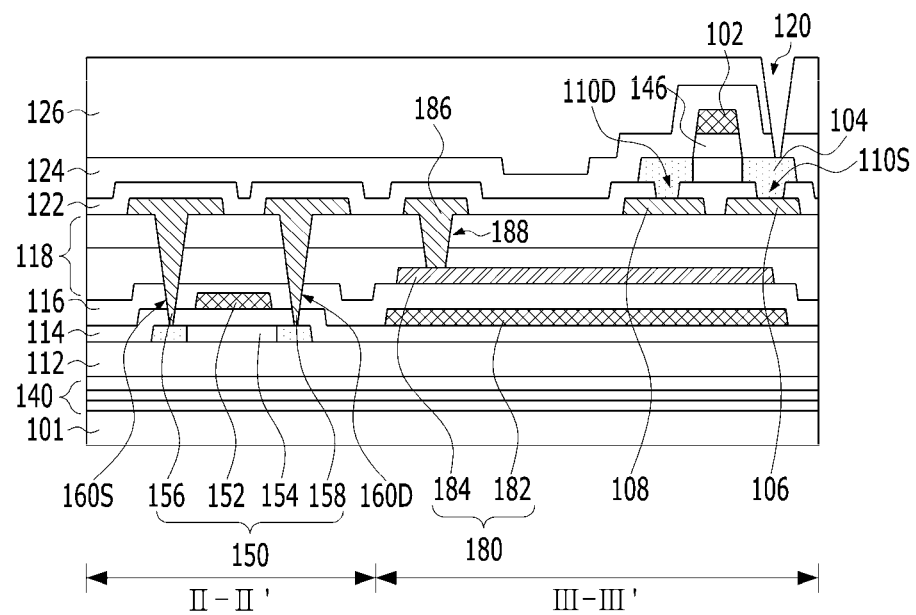
Figure 9J:
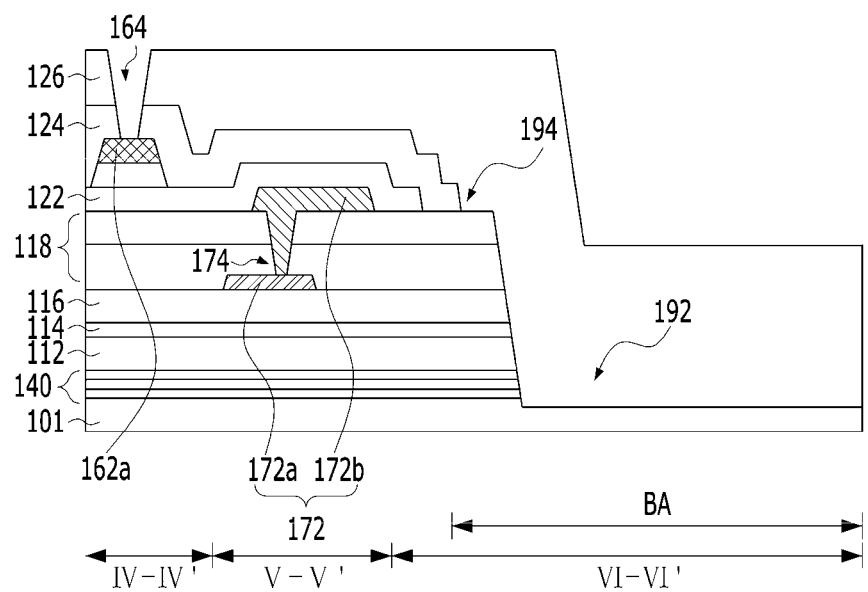
Figure 9K:
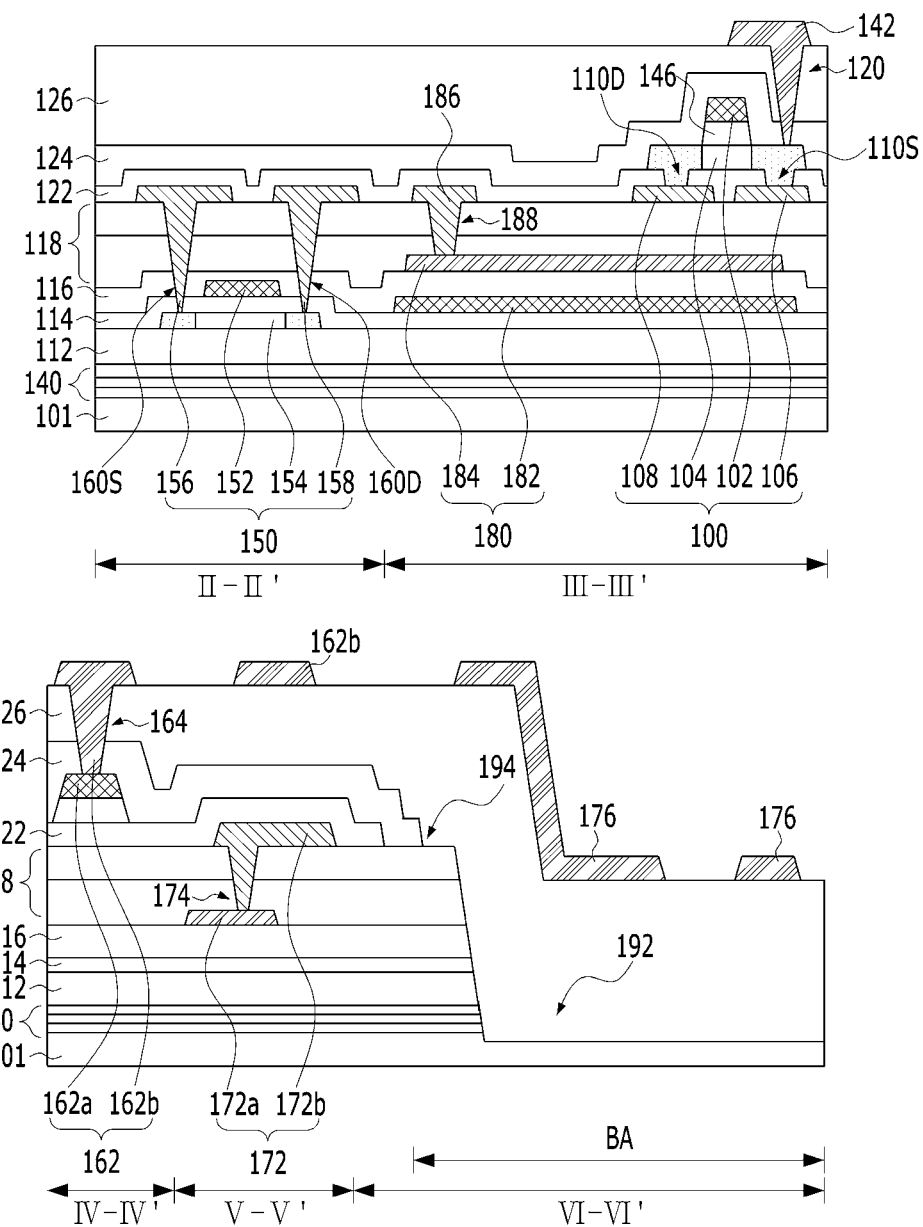
Figure 9L:
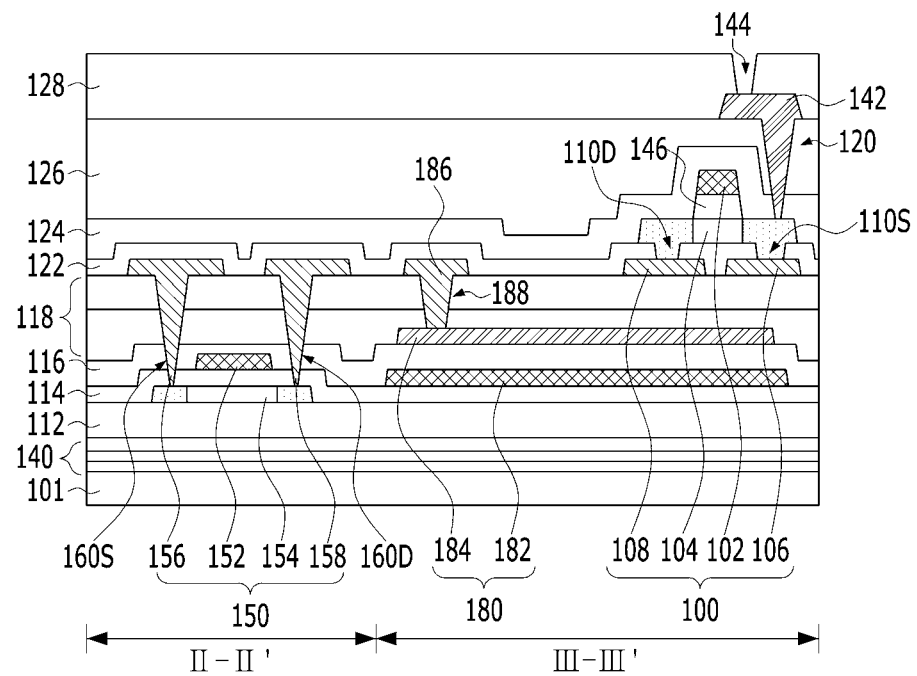
Figure 9L:
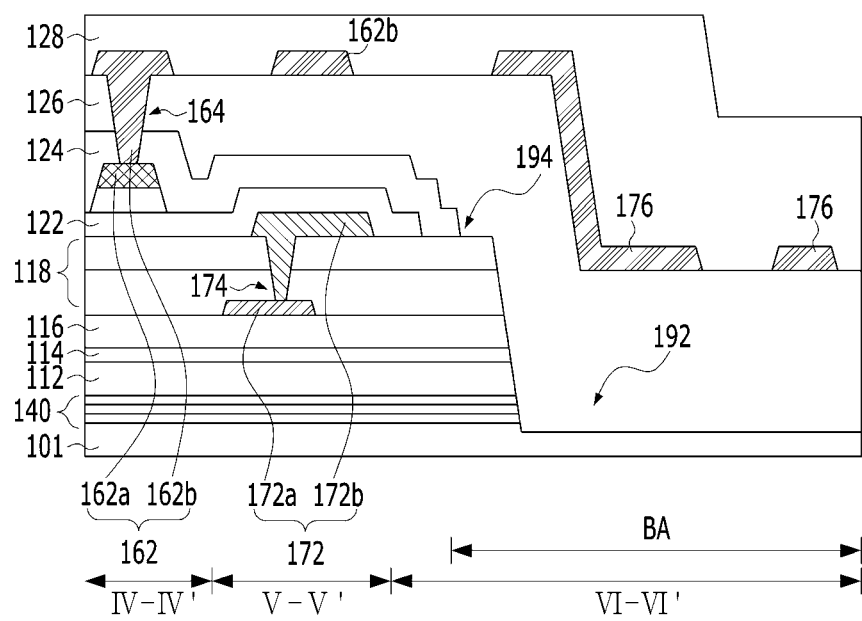
Figure 9M:
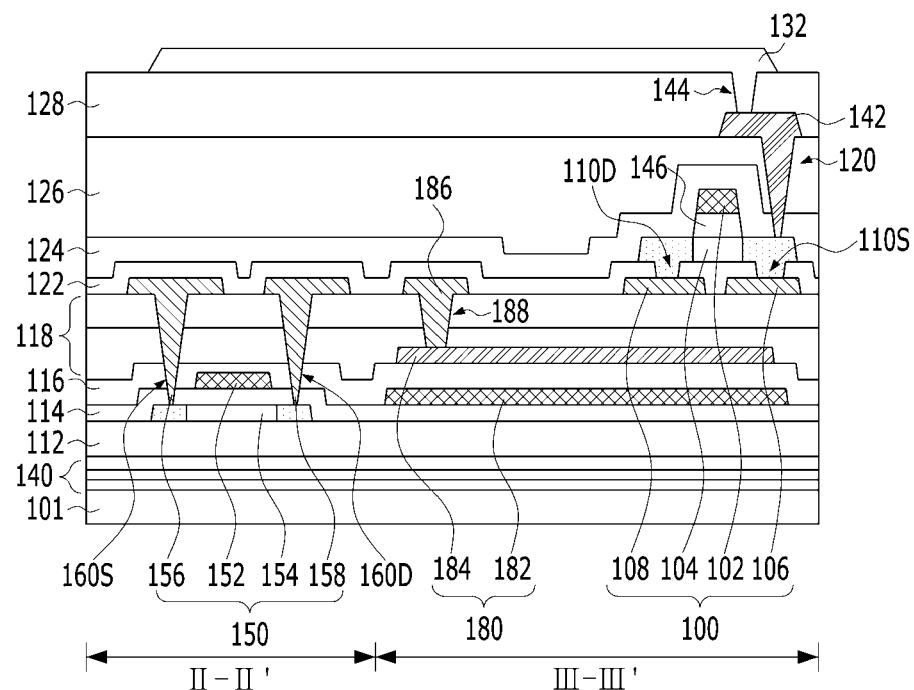
Figure 9M:
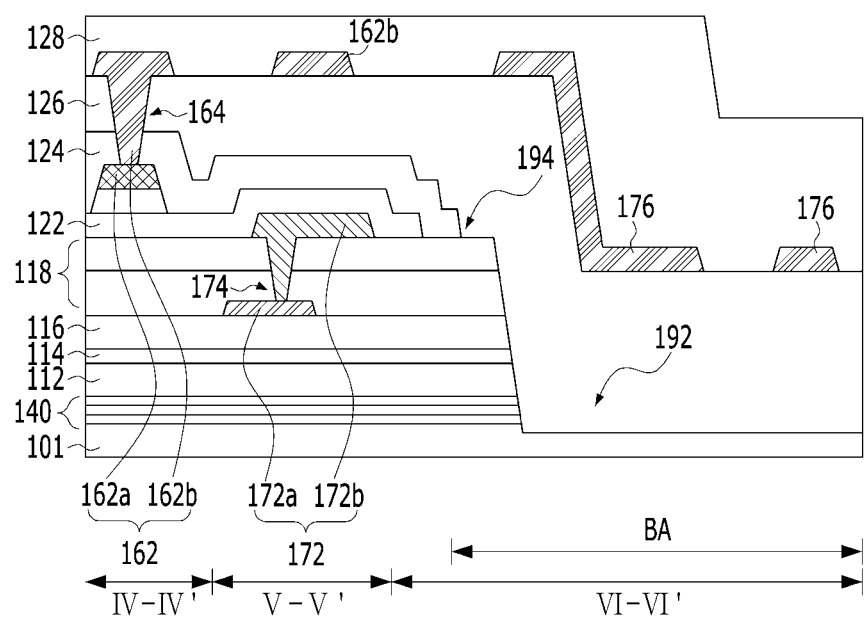
Figure 9N:
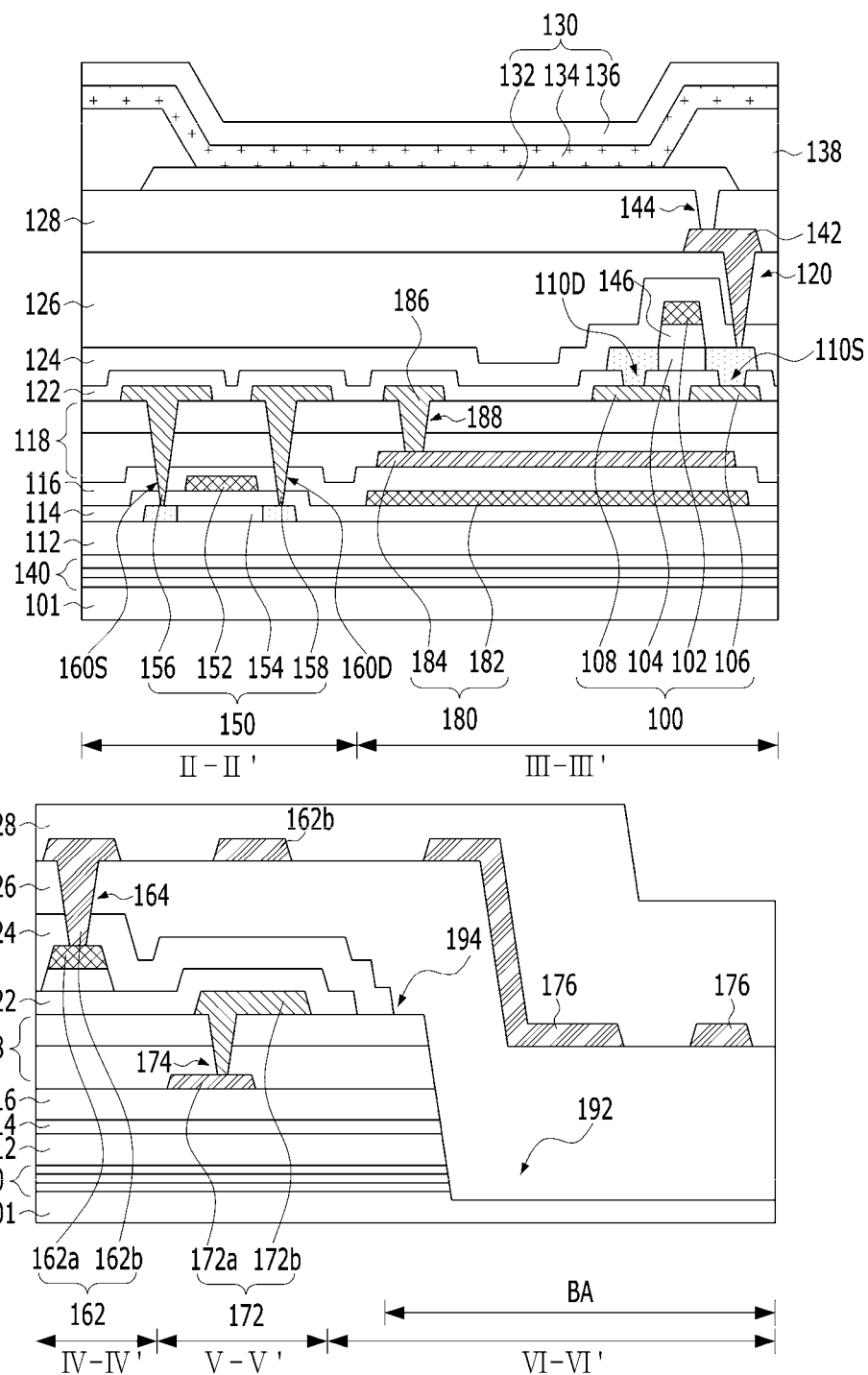

FIGS. 9A to 9N are cross-sectional views for explaining a method of manufacturing the organic light-emitting display device illustrated in FIG. 7.

Referring to FIG. 9A, the multilayered buffer layer 140, the lower buffer layer 112, and the polycrystalline semiconductor layer 154 are sequentially formed on the substrate 101.

Specifically, the multilayered buffer layer 140 is formed on the substrate 101 by alternately stacking SiOx and SiNx at least one time. Subsequently, the lower buffer layer 112 is formed by depositing SiOx or SiNx over the entire surface of the multilayered buffer layer 140. Subsequently, a thin amorphous silicon layer is formed on the substrate 101 having the lower buffer layer 112 formed thereon by low pressure chemical vapor deposition (LPCVD) or plasma enhanced chemical vapor deposition (PECVD), for example. Subsequently, a thin polycrystalline silicon layer is formed by crystallizing the thin amorphous silicon layer. Subsequently, the polycrystalline semiconductor layer 154 is formed by patterning the thin polycrystalline silicon layer through a photolithography process and an etching process using the thin polycrystalline silicon layer as a first mask.

Referring to FIG. 9B, the lower gate insulation layer 114 is formed on the substrate 101 having the polycrystalline semiconductor layer 154 formed thereon, and the first gate electrode 152 and the lower storage electrode 182 are formed on the gate insulation layer 114.

Specifically, the lower gate insulation layer 114 is formed by depositing an inorganic insulation material such as SiOx or SiNx over the entire surface of the substrate 101 having the polycrystalline semiconductor layer 154 formed thereon. Subsequently, after a first conductive layer is deposited over the entire surface of the lower gate insulation layer 114, the first conductive layer is patterned through a photolithography process and an etching process using a second mask, so that the first gate electrode 152 and the lower storage electrode 182 are formed. Subsequently, when the polycrystalline semiconductor layer 154 is doped with a dopant through a doping process using the first gate electrode 152 as a mask, source and drain areas are formed so as not to overlap the first gate electrode 152, and a channel area is formed so as to overlap the first gate electrode 152.

Referring to FIG. 9C, at least one first lower interlayer insulation layer 116 is formed on the substrate 101 having the first gate electrode 152 and the lower storage electrode 182 formed thereon, and the upper storage electrode 184 and the first high-potential supply line 172a are formed on the first lower interlayer insulation layer 116.

Specifically, the first lower interlayer insulation layer 116 is formed by depositing an inorganic insulation material such as SiOx or SiNx over the entire surface of the substrate 101 having the first gate electrode 152 and the lower storage electrode 182 formed thereon. Subsequently, after a second conductive layer is deposited over the entire surface of the first lower interlayer insulation layer 116, the second conductive layer is patterned through a photolithography process and an etching process using a third mask, so that the upper storage electrode 184 and the first high-potential supply line 172a are formed.

Referring to FIG. 9D, at least one second lower interlayer insulation layer 118 is formed on the substrate 101 having the upper storage electrode 184 and the first high-potential supply line 172a formed thereon, and the first source and first drain contact holes 160S and 160D, the storage contact hole 188, the second line contact hole 174, and the first opening 192 are formed.

Specifically, the second lower interlayer insulation layer 118 is formed by depositing an inorganic insulation material such as SiOx or SiNx over the entire surface of the substrate 101 having the upper storage electrode 184 and the first high-potential supply line 172a formed thereon. Subsequently, the multilayered buffer layer 140, the lower buffer layer 112, the lower gate insulation layer 114, the first lower interlayer insulation layer 116, and the second lower interlayer insulation layer 118 are selectively patterned through a photolithography process and an etching process using a fourth mask. Thereby, the first source and first drain contact holes 160S and 160D, the storage contact hole 188, and the second line contact hole 174 are formed, and the first opening 192 is formed in the bending area BA. At this time, the first source and first drain contact holes 160S and 160D are formed so as to penetrate the lower gate insulation layer 114, the first lower interlayer insulation layer 116, and the second lower interlayer insulation layer 118, and the storage contact hole 188 and the second line contact hole 174 are formed so as to penetrate the second lower interlayer insulation layer 118. The first opening 192 is formed so as to penetrate the multilayered buffer layer 140, the lower buffer layer 112, the lower gate insulation layer 114, the first lower interlayer insulation layer 116, and the second lower interlayer insulation layer 118.

Referring to FIG. 9E, the first and second source electrodes 156 and 106, the first and second drain electrodes 158 and 108, the storage supply line 186, and the second high-potential supply line 172b are formed on the substrate 101 having therein the first source and first drain contact holes 160S and 160D, the storage contact hole 188, the second line contact hole 174, and the first opening 192.

Specifically, a third conductive layer is deposited using Mo, Ti, Cu, AlNd, Al, Cr, or an alloy thereof over the entire surface of the substrate 101 having therein the first source and first drain contact holes 160S and 160D, the storage contact hole 188, the second line contact hole 174, and the first opening 192. Subsequently, when the third conductive layer is patterned through a photolithography process and an etching process using a fifth mask, the first and second source electrodes 156 and 106, the first and second drain electrodes 158 and 108, the storage supply line 186, and the second high-potential supply line 172b are formed.

Referring to FIG. 9F, the upper buffer layer 122 having therein the second source and second drain contact holes 110S and 110D is formed on the substrate 101 having the first and second source electrodes 156 and 106, the first and second drain electrodes 158 and 108, the storage supply line 186, and the second high-potential supply line 172b formed thereon.

Specifically, the upper buffer layer 122 is formed by depositing an inorganic insulation material such as SiNx or SiOx over the entire surface of the substrate 101 having the first and second source electrodes 156 and 106, the first and second drain electrodes 158 and 108, the storage supply line 186, and the second high-potential supply line 172b formed thereon. Subsequently, when the upper buffer layer 122 is patterned through a photolithography process and an etching process using a sixth mask, the second source and second drain contact holes 110S and 110D are formed.

Referring to FIG. 9G, the oxide semiconductor layer 104 is formed on the substrate 101 having the upper buffer layer 112 formed thereon.

Specifically, after the oxide semiconductor layer 104 is deposited over the entire surface of the substrate 101 having the upper buffer layer 122, which includes the second source and second drain contact holes 110S and 110D, formed thereon, the oxide semiconductor layer 104 is patterned through a photolithography process and an etching process using a seventh mask, so that the oxide semiconductor layer 104 is completely formed.

Referring to FIG. 9H, the upper gate insulation pattern 146, the second gate electrode 102, and the first low-potential supply line 162a are formed on the substrate 101 having the oxide semiconductor layer 104 formed thereon.

Specifically, an upper gate insulation layer is formed on the substrate 101 having the oxide semiconductor layer 104 formed thereon, and a fourth conductive layer is formed by deposition such as sputtering. The upper gate insulation layer is formed using an inorganic insulation material such as SiOx or SiNx. The fourth conductive layer may be formed in a single layer using a metal material such as Mo, Ti, Cu, AlNd, Al, Cr, or an alloy thereof, or may be formed in multiple layers using the same. Subsequently, the fourth conductive layer and the upper gate insulation layer are patterned at the same time through a photolithography process and an etching process using an eighth mask, so that each of the second gate electrode 102 and the first low-potential supply line 162a and the upper gate insulation pattern 146 thereunder are formed so as to have the same pattern. At this time, when the upper gate insulation layer is subjected to dry etching, the oxide semiconductor layer 104, which does not overlap the second gate electrode 102, is exposed to plasma, and oxygen in the oxide semiconductor layer 104 exposed to plasma is removed via reaction with plasma gas. Thereby, the oxide semiconductor layer 104, which does not overlap the second gate electrode 102, becomes a conductor, and is formed into source and drain areas.

Referring to FIG. 9I, the upper interlayer insulation layer 124 having therein the second opening 194, the first pixel contact hole 120, and the first line contact hole 164 is formed on the substrate 101 having the upper gate insulation pattern 146, the second gate electrode 102, and the first low-potential supply line 162a formed thereon.

Specifically, the upper interlayer insulation layer 124 is formed by depositing an inorganic insulation material such as SiOx or SiNx over the entire surface of the substrate 101 having the upper gate insulation pattern 146, the second gate electrode 102 and the first low-potential supply line 162a formed thereon. Subsequently, the upper interlayer insulation layer 124 is patterned through a photolithography process and an etching process using a ninth mask, so that the first pixel contact hole 120, the first line contact hole 164, and the second opening 194 are formed. At this time, the first pixel contact hole 120 is formed so as to penetrate the upper interlayer insulation layer 124, thereby exposing the source area of the oxide semiconductor layer 104. The first line contact hole 164 is formed so as to penetrate the upper interlayer insulation layer 124, thereby exposing the first low-potential supply line 162a. The second opening 194 exposes the substrate 101 in the bezel area BA when the upper interlayer insulation layer 124 is removed from the bezel area BA.

Referring to FIG. 9J, the first planarization layer 126 is formed on the substrate 101 having the upper interlayer insulation layer 124 formed thereon.

Specifically, when an organic insulation material such as an acryl-based resin is deposited over the entire surface of the substrate 101 having the upper interlayer insulation layer 124 formed thereon, the first planarization layer 126 is formed. Subsequently, the first planarization layer 126 is patterned through a photolithography process using a tenth mask, so that the first pixel contact hole 120 and the first line contact hole 164 are formed so as to penetrate the first planarization layer 126.

Referring to FIG. 9K, the pixel connection electrode 142, the second low-potential supply line 162b, and the signal link 176 are formed on the substrate 101 having the first planarization layer 126 formed thereon.

Specifically, a fifth conductive layer is deposited using Mo, Ti, Cu, AlNd, Al, Cr, or an alloy thereof over the entire surface of the substrate 101 having the first planarization layer 126 formed thereon. Subsequently, the fifth conductive layer is patterned through a photolithography process and an etching process using an eleventh mask, the pixel connection electrode 142, the second low-potential supply line 162b, and the signal link 176 are formed.

Referring to FIG. 9L, the second planarization layer 128 having therein the second pixel contact hole 144 is formed on the substrate 101 having the pixel connection electrode 142, the second low-potential supply line 162b, and the signal link 176 formed thereon.

Specifically, the second planarization layer 128 is formed by depositing an organic insulation material such as an acryl-based resin over the entire surface of the substrate 101 having the pixel connection electrode 142, the second low-potential supply line 162b, and the signal link 176 formed thereon. Subsequently, the second planarization layer 128 is patterned through a photolithography process using a twelfth mask, the second pixel contact hole 144 is formed.

Referring to FIG. 9M, the anode electrode 132 is formed on the substrate 101 having the second planarization layer 128, which includes the second pixel contact hole 144, formed therein.

Specifically, a sixth conductive layer is deposited over the entire surface of the substrate 101 having the second planarization layer 128, in which the second pixel contact hole 144 is formed, formed thereon. The sixth conductive layer is formed using a transparent conductive layer and an opaque conductive layer. Subsequently, the sixth conductive layer is patterned through a photolithography process and an etching process using a thirteenth mask, so that the anode electrode 132 is formed.

Referring to FIG. 9N, the bank 138, the organic emission stack 134, and the cathode electrode 136 are sequentially formed on the substrate 101 having the anode electrode 132 formed thereon.

Specifically, after a bank photosensitive layer is applied to the entire surface of the substrate 101 having the anode electrode 132 formed thereon, the bank photosensitive layer is patterned through a photolithography process using a fourteenth mask, so that the bank 138 is formed. Subsequently, the emission stack 134 and the cathode electrode 136 are sequentially formed in the active area AA, excluding the non-active area NA, through a deposition process using a shadow mask.

As described above, in the present disclosure, the first opening 192 in the bending area BA and the first source and first drain contact holes 160S and 160D are formed through the same single mask process, the second opening 194 in the bending area BA and the second source and second drain contact holes 110S and 110D are formed through the same single mask process, and the first source and first drain electrodes 156 and 158 and the second source and second drain electrodes 106 and 108 are formed through the same single mask process, whereby it is possible to reduce the number of mask processes by at least three compared to the related art. Thereby, the organic light-emitting display device according to the present disclosure may simplify the structure and the manufacturing process thereof as a result of reducing the number of mask processes compared to the related art, which may improve productivity.

As is apparent from the above description, according to the present disclosure, a second thin-film transistor having an oxide semiconductor layer is used as a driving transistor of each subpixel and a first thin-film transistor having a polycrystalline semiconductor layer is used as a switching element of each subpixel, which may reduce power consumption. In addition, according to the present disclosure, since an opening in a bending area and a plurality of contact holes in an active area are formed through the same mask process, a signal link in the bending area is disposed on a substrate. Thereby, the present disclosure may simplify the structure of a display device and the manufacturing process thereof, which may improve productivity.

Although the embodiments of the present disclosure have been described above in detail with reference to the accompanying drawings, it will be apparent to those skilled in the art that the present disclosure described above is not limited to the embodiments described above, and various substitutions, modifications, and alterations may be devised within the spirit and scope of the present disclosure. Thus, the embodiments disclosed in the specification of the present disclosure are not intended to limit the present disclosure, and the technical scope of the present disclosure should be interpreted based on the following claims, and all technical ideas that fall within the range equivalent to the claims should be understood as belonging to the scope of the present disclosure.

What is claimed is:

1. A display device comprising:
    a substrate comprising an active area and a bending area;
    an organic light-emitting element disposed in the active area;
    a first thin-film transistor disposed in the active area and comprising a first semiconductor layer;
    a second thin-film transistor disposed in the active area and comprising a second semiconductor layer;
    a plurality of insulating layers disposed between the substrate and the organic light-emitting element;
    at least one opening located in the bending area, the at least one opening exposing lateral surfaces of the plurality of insulating layers;
    a first planarization layer disposed in the bending area and disposed on the lateral surfaces of the plurality of insulating layers disposed under the second thin-film transistor; and
    a signal link connected to a signal line disposed in the active area, the signal link being disposed in the bending area.

2. A display device comprising:
    a substrate comprising an active area and a bending area;
    an organic light-emitting element disposed in the active area;
    a first thin-film transistor disposed in the active area and comprising a first semiconductor layer;
    a second thin-film transistor disposed in the active area and comprising a second semiconductor layer;
    a plurality of insulating layers disposed between the substrate and the organic light-emitting element at least one opening located in the bending area, the at least one opening exposing lateral surfaces of the plurality of insulating layers;
    a first planarization layer disposed on the lateral surfaces of the plurality of insulating layers in the bending area; and
    a signal link connected to a signal line disposed in the active area, the signal link being disposed in the bending area,
    wherein the first thin-film transistor comprises a first gate electrode configured to overlap the first semiconductor layer, and a first source electrode and a first drain electrode located on the first semiconductor layer, and
    wherein the second thin-film transistor comprises a second gate electrode configured to overlap the second semiconductor layer and second source and second drain electrodes located below the second semiconductor layer.

3. The display device according to claim 2, wherein each of the first and second source electrodes and the first and second drain electrodes are disposed below the second semiconductor layer.

4. The display device according to claim 2, further comprising:
    a multilayered buffer layer disposed on the substrate;
    a lower buffer layer disposed on the multilayered buffer layer;
    at least one lower insulation layer disposed between each of the first source electrode and first drain electrode and the first semiconductor layer;
    a first source contact hole and a first drain contact hole formed in the at least one lower insulation layer to expose the first semiconductor layer;
    an upper buffer layer disposed between each of the second source electrode and second drain electrode and the second semiconductor layer; and
    a second source contact hole and a second drain contact hole formed in the upper buffer layer to expose the second semiconductor layer,
    wherein the at least one opening comprises a first opening,
    wherein the first opening goes through the multilayered buffer layer, the lower buffer layer, and the at least one lower insulation layer, which are disposed in the bending area.

5. The display device according to claim 4, further comprising:
    an upper interlayer insulation layer disposed to cover the second thin-film transistor,
    wherein the at least one opening further comprises a second opening, and wherein the second opening goes through the upper interlayer insulation layer disposed in the bending area.

6. The display device according to claim 5, wherein the first opening has a depth greater than that of the first source contact hole and the first drain contact hole.

7. The display device according to claim 5, wherein a portion of a lateral surface of the substrate in the bending area is exposed by the first opening.

8. The display device according to claim 7, wherein the at least one lower insulation layer comprises:
  a lower gate insulation layer disposed between the lower buffer layer and the first gate electrode;
  at least one first lower interlayer insulation layer disposed on the lower gate insulation layer; and
  at least one second lower interlayer insulation layer disposed on an upper-most surface of the at least one first lower interlayer insulation layer,
  wherein the first and second source electrodes and the first and second drain electrodes are formed on the upper-most surface of the at least one second lower interlayer insulation layer using a same material, and
  wherein the second semiconductor layer is disposed on the upper buffer layer, which covers the first source electrode, the second source electrode, the first drain electrode, and the second drain electrode.

9. The display device according to claim 8, further comprising:
  a lower storage electrode disposed on the lower gate insulation layer; and
  an upper storage electrode configured to overlap the lower storage electrode with the at least one first lower interlayer insulation layer interposed therebetween,
  wherein at least one of the lower storage electrode and the upper storage electrode overlaps the second semiconductor layer.

10. The display device according to claim 9, wherein the lower storage electrode is formed in a same plane as the first gate electrode using a same material as the first gate electrode.

11. The display device according to claim 5, further comprising:
  a low-potential supply line connected to a cathode electrode of the organic light-emitting element; and
  a high-potential supply line disposed to overlap the low-potential supply line,
  wherein at least one of the low-potential supply line or the high-potential supply line is disposed in a mesh form.

12. The display device according to claim 11, further comprising:
  a pixel connection electrode disposed on the first planarization layer to come into contact with the second semiconductor layer; and
  a second planarization layer disposed to cover the pixel connection electrode, wherein the first planarization layer is disposed on an upper interlayer insulation layer.

13. The display device according to claim 12, wherein the low-potential supply line comprises first and second low-potential supply lines crossing each other, and
  wherein the high-potential supply line comprises:
  a first high-potential supply line disposed parallel to the first low-potential supply line; and
  a second high-potential supply line disposed to overlap the second low-potential supply line with the upper buffer layer, the upper interlayer insulation layer, and the first planarization layer interposed therebetween.

14. The display device according to claim 13, wherein the second low-potential supply line is formed in a same plane as the pixel connection electrode using the same material as the pixel connection electrode, and
  wherein the second high-potential supply line is formed in a same plane as the second source and second drain electrodes using a same material as the second source and second drain electrodes.

15. The display device according to claim 12, wherein the signal link is disposed in the bending area on the substrate to come into contact with the substrate, and the signal link is formed of a same material as the first and second source electrodes, and
  wherein at least one of the first and second planarization layers are disposed to cover the signal link.

16. The display device according to claim 12, wherein the signal link is disposed in the bending area on the first planarization layer, and the signal link is formed of a same material as the pixel connection electrode, and
  wherein the second planarization layer is disposed to cover the signal link.

17. The display device according to claim 11, further comprising a pixel-driving circuit configured to drive the organic light-emitting element, and
  wherein the pixel-driving circuit comprises:
  a driving transistor formed of the second thin-film transistor; and
  a switching transistor connected to the driving transistor and formed of the first thin-film transistor.

18. The display device according to claim 17, wherein the pixel-driving circuit further comprises:
  a second switching transistor formed of the second thin-film transistor and connected to the driving transistor; and
  a third switching transistor formed of the first thin-film transistor and connected to the high-potential supply line.

19. The display device according to claim 1, wherein the first semiconductor layer includes a polycrystalline semiconductor layer and the second semiconductor layer includes an oxide semiconductor layer.

20. The display device according to claim 1, wherein a thickness of a portion of the substrate that overlaps the at least one opening is less than a thickness of a portion of the substrate that is not overlapping with the at least one opening.

21. A display device comprising:
  a substrate comprising an active area and a bending area;
  an organic light-emitting element disposed in the active area;
  a first thin-film transistor disposed in the active area and comprising a first semiconductor layer;
  a second thin-film transistor disposed in the active area and comprising a second semiconductor layer;
  an inorganic insulation layer disposed in the active area and the bending area;
  an organic planarization layer disposed on the inorganic insulation layer in the active area and disposed in the bending area;
  a contact hole in the active area through a first portion of the inorganic insulation layer disposed in the active area and a first portion of the organic planarization layer disposed in the active area, wherein the organic light-emitting element is connected to the second thin-film transistor through the contact hole;
  an opening in a second portion of the inorganic insulation layer disposed in the bending area; and
  a signal link connected to a signal line disposed in the active area, the signal link being disposed in the bending area, wherein the signal link is on a top surface of a second portion of the organic planarization layer in the bending area, the second portion of the organic planarization layer in the bending area contiguous with the first portion of the organic planarization layer in the active area.

* * * * *